(12) United States Patent
Lim et al.

(10) Patent No.: US 10,964,714 B2
(45) Date of Patent: Mar. 30, 2021

(54) THREE-DIMENSIONAL SEMICONDUCTOR MEMORY DEVICE

(71) Applicant: Samsung Electronics Co., Ltd, Suwon-si (KR)

(72) Inventors: Geunwon Lim, Yongin-si (KR); SangJun Hong, Hwaseong-si (KR); Seokcheon Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/259,086

(22) Filed: Jan. 28, 2019

(65) Prior Publication Data

US 2019/0393238 A1 Dec. 26, 2019

(30) Foreign Application Priority Data

Jun. 21, 2018 (KR) .......................... 10-2018-0071518

(51) Int. Cl.

| | |
|---|---|
| *H01L 27/11582* | (2017.01) |
| *H01L 27/11565* | (2017.01) |
| *H01L 27/1157* | (2017.01) |
| *H01L 27/11573* | (2017.01) |
| *H01L 23/522* | (2006.01) |
| *H01L 29/423* | (2006.01) |
| *H01L 21/28* | (2006.01) |
| *H01L 27/11519* | (2017.01) |

(Continued)

(52) U.S. Cl.
CPC .... *H01L 27/11582* (2013.01); *H01L 23/5226* (2013.01); *H01L 27/1157* (2013.01); *H01L 27/11565* (2013.01); *H01L 27/11573* (2013.01); *H01L 29/40117* (2019.08); *H01L 29/42344* (2013.01); *H01L 27/11519* (2013.01); *H01L 27/11524* (2013.01); *H01L 27/11526* (2013.01); *H01L 27/11556* (2013.01); *H01L 29/42328* (2013.01)

(58) Field of Classification Search
CPC .................................................. H01L 27/11582
See application file for complete search history.

(56) References Cited

U.S. PATENT DOCUMENTS

| | | |
|---|---|---|
| 5,386,391 A | 1/1995 | Watanabe |
| 8,680,605 B2 | 3/2014 | Jeon et al. |

(Continued)

FOREIGN PATENT DOCUMENTS

| | | |
|---|---|---|
| KR | 0136745 B1 | 4/1998 |
| KR | 10-1325492 B1 | 11/2013 |

*Primary Examiner* — Laura M Menz
*Assistant Examiner* — Khatib A Rahman
(74) *Attorney, Agent, or Firm* — Harness, Dickey & Pierce, P.L.C.

(57) ABSTRACT

A three-dimensional semiconductor memory device includes a substrate, an electrode structure including gate electrodes sequentially stacked on the substrate, a source structure between the electrode structure and the substrate, vertical semiconductor patterns passing through the electrode structure and the source structure, a data storage pattern between each of the vertical semiconductor patterns and the electrode structure, and a common source pattern between the source structure and the substrate. The common source pattern has a lower resistivity than the source structure and is connected to the vertical semiconductor patterns through the source structure.

26 Claims, 30 Drawing Sheets

(51) Int. Cl.
*H01L 27/11524* (2017.01)
*H01L 27/11526* (2017.01)
*H01L 27/11556* (2017.01)

(56) References Cited

U.S. PATENT DOCUMENTS

| | | | | |
|---|---|---|---|---|
| 8,987,089 | B1* | 3/2015 | Pachamuthu | H01L 27/1052 |
| | | | | 438/268 |
| 9,530,789 | B2* | 12/2016 | Lee | H01L 27/11565 |
| 9,559,112 | B2* | 1/2017 | Lee | H01L 29/4234 |
| 9,559,117 | B2* | 1/2017 | Pachamuthu | H01L 23/53233 |
| 9,779,948 | B1* | 10/2017 | Baraskar | H01L 27/11519 |
| 9,786,676 | B2* | 10/2017 | Yun | H01L 27/11565 |
| 9,831,266 | B2* | 11/2017 | Kai | H01L 27/11565 |
| 9,870,991 | B1 | 1/2018 | Kim et al. | |
| 10,347,654 | B1* | 7/2019 | Iwai | H01L 27/11519 |
| 2010/0013049 | A1* | 1/2010 | Tanaka | H01L 27/11575 |
| | | | | 257/532 |
| 2010/0309729 | A1* | 12/2010 | Chang | H01L 27/11568 |
| | | | | 365/185.28 |
| 2011/0291172 | A1* | 12/2011 | Hwang | H01L 27/11582 |
| | | | | 257/314 |
| 2018/0047747 | A1* | 2/2018 | Tang | H01L 27/11565 |
| 2019/0280001 | A1* | 9/2019 | Terasawa | H01L 27/11556 |
| 2019/0333931 | A1* | 10/2019 | Jung | H01L 27/1157 |

* cited by examiner

FIG. 6
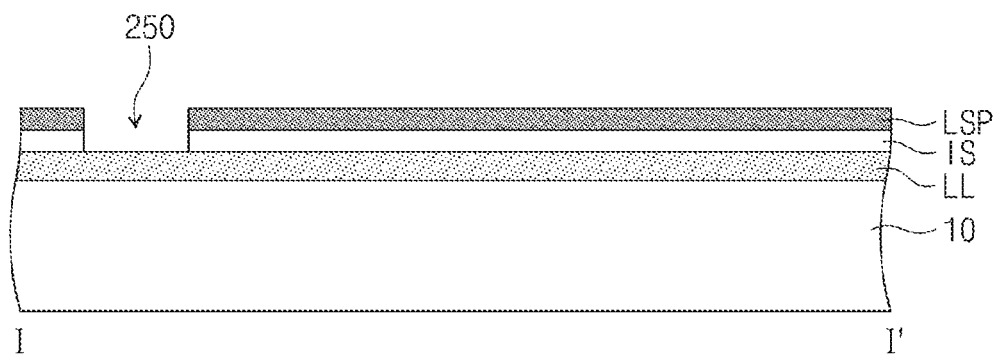
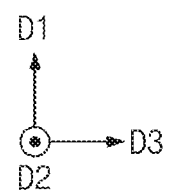
FIG. 7
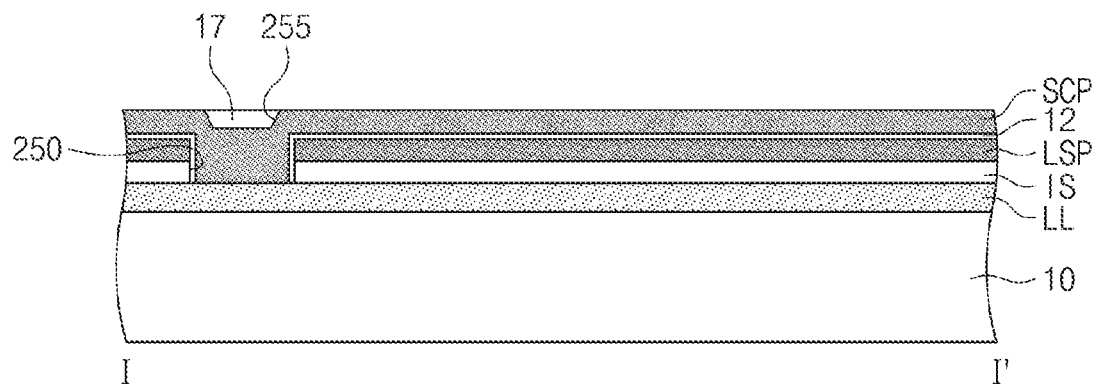
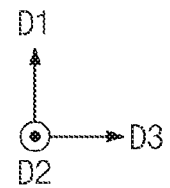

FIG. 16
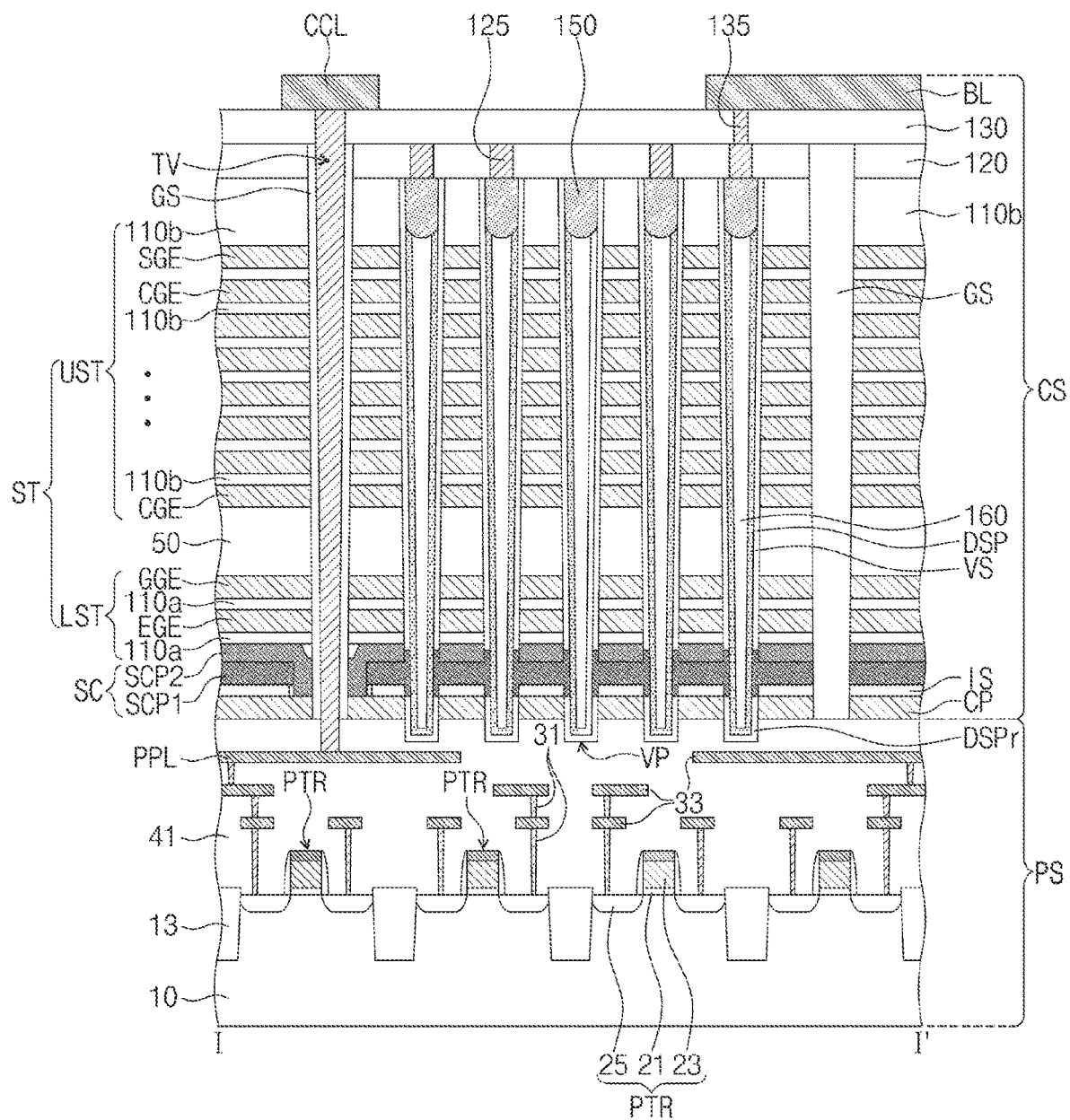
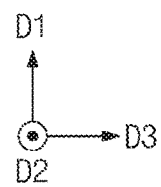

FIG. 18
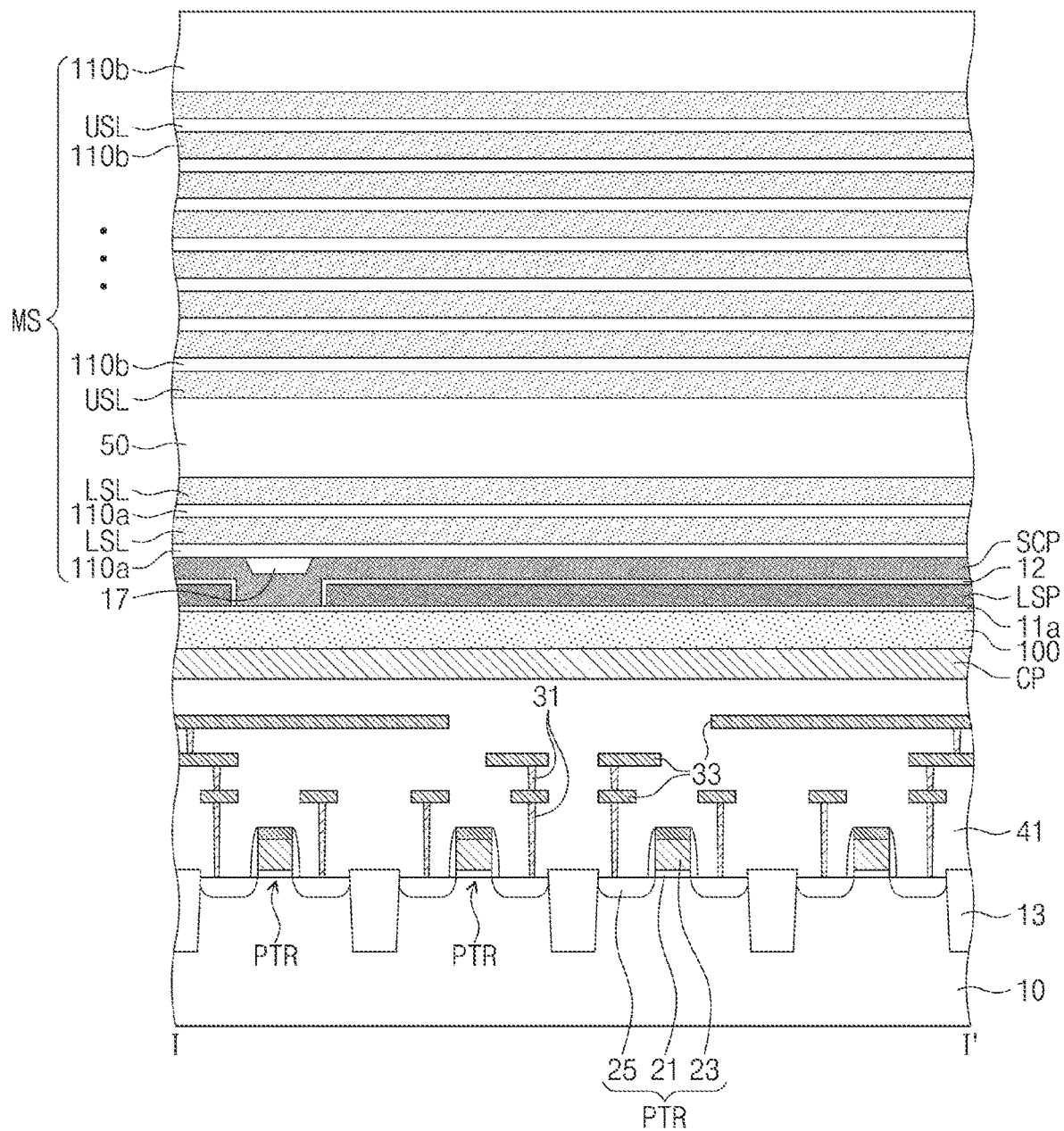
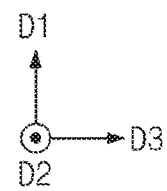

FIG. 19
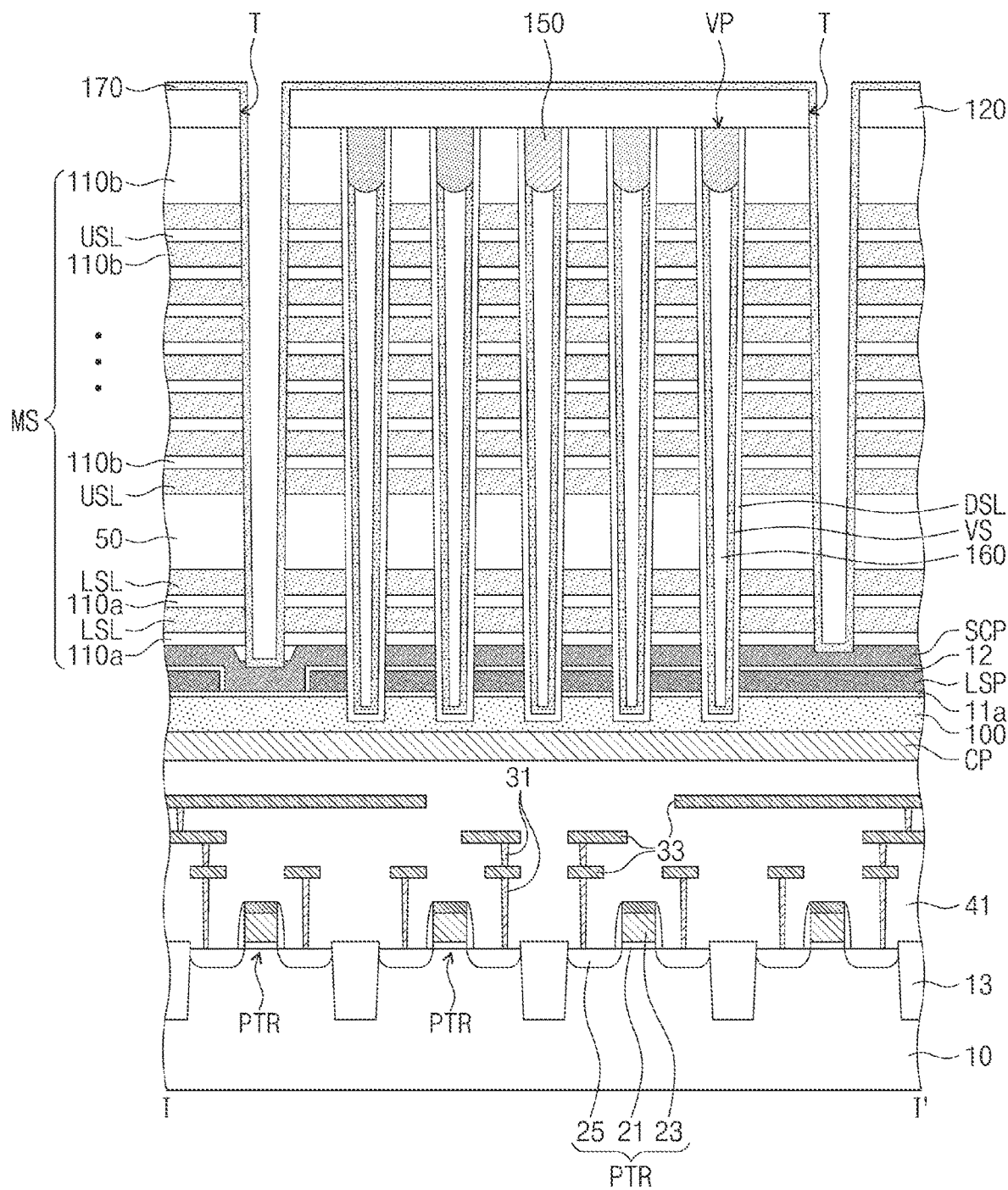
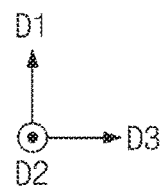

FIG. 20
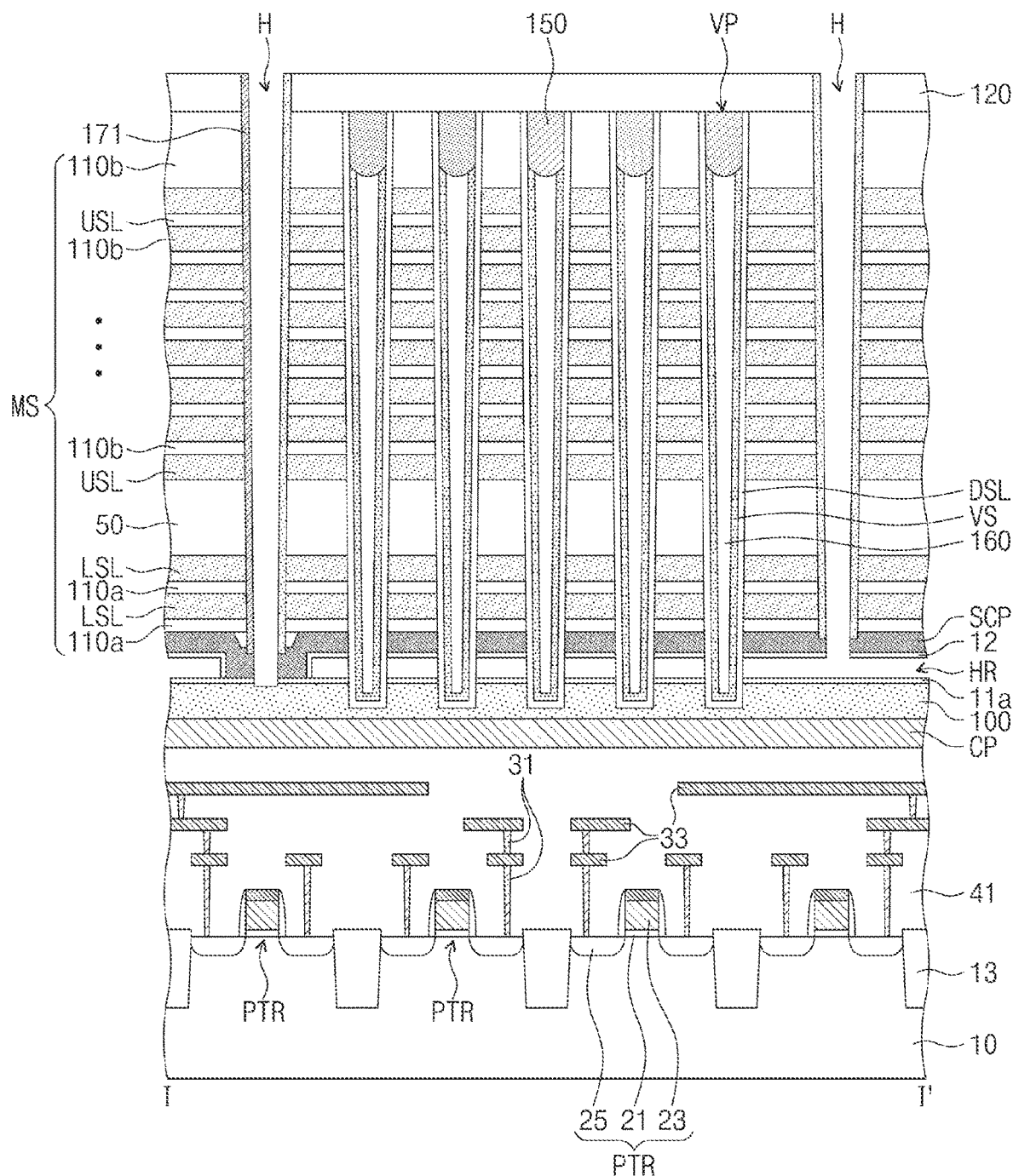
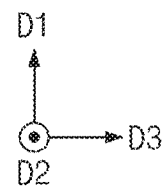

FIG. 22
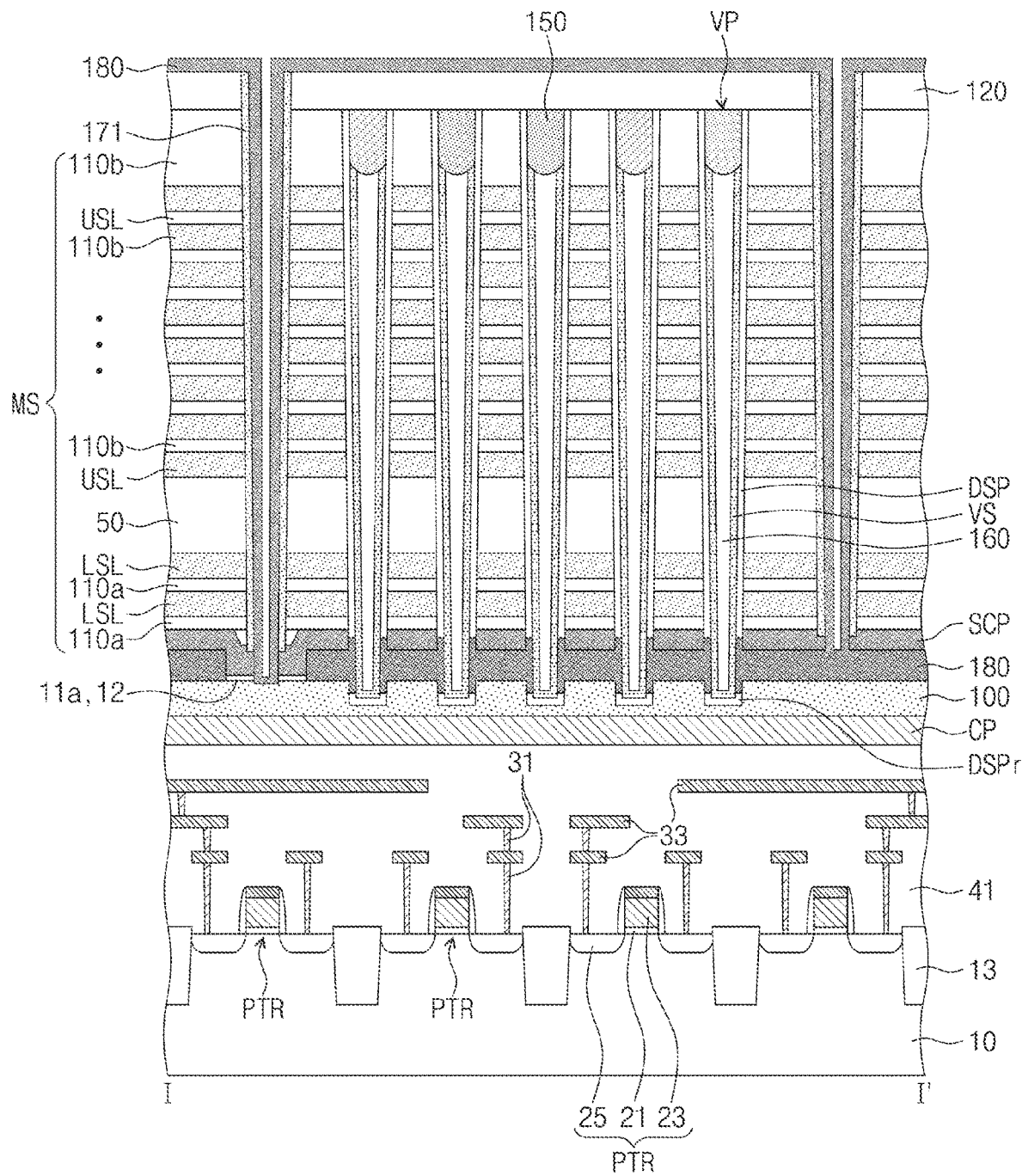
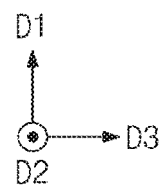

THREE-DIMENSIONAL SEMICONDUCTOR MEMORY DEVICE

CROSS-REFERENCE TO RELATED APPLICATION

This application claims priority under 35 U.S.C. § 119 to Korean Patent Application No. 10-2018-0071518 filed on Jun. 21, 2018 in the Korean Intellectual Property Office, the disclosure of which is hereby incorporated by reference in its entirety.

TECHNICAL FIELD

Example embodiments of the present disclosure relate to a semiconductor memory device, and more specifically, to a three-dimensional semiconductor memory device including memory cells arranged three-dimensionally.

DISCUSSION OF RELATED ART

A semiconductor device is highly integrated to meet demands of high performance and low costs. For example, an integration degree of a two-dimensional (2D) or planar semiconductor device is mainly determined by an area used for a unit memory cell. Therefore, the integration density of the 2D or planar semiconductor device depends on a technique used for a fine pattern formation. However, a high-cost equipment is required for such a fine pattern formation in a 2D or planar semiconductor manufacturing process and increase of the integration density of the 2D or planar semiconductor device is limited.

A three-dimensional semiconductor memory device including memory cells arranged three-dimensionally has been developed to overcome the above limitations.

SUMMARY

According to example embodiments of the inventive concepts, a three-dimensional semiconductor memory device may include a substrate, an electrode structure including gate electrodes sequentially stacked on the substrate, a source structure between the electrode structure and the substrate, vertical semiconductor patterns passing through the electrode structure and the source structure, a data storage pattern between each of the vertical semiconductor patterns and the electrode structure, and a common source pattern between the source structure and the substrate. The common source pattern may have a lower resistivity than the source structure and may be connected to the vertical semiconductor patterns through the source structure.

According to example embodiments of the inventive concepts, a three-dimensional semiconductor memory device may include a substrate, an electrode structure including gate electrodes stacked on the substrate, a source structure between the electrode structure and the substrate, vertical semiconductor patterns passing through the electrode structure and the source structure, a data storage pattern between each of the vertical semiconductor patterns and the electrode structure, a common source pattern between the source structure and the substrate and connected to a lower surface of the source structure, and a source insulation pattern between the source structure and the common source pattern. The vertical semiconductor patterns may pass through the common source pattern.

According to example embodiments of the inventive concepts, a three-dimensional semiconductor memory device may include a substrate, an electrode structure including gate electrodes stacked on the substrate, a source structure between the electrode structure and the substrate, vertical semiconductor patterns passing through the electrode structure and the source structure, a data storage pattern between each of the vertical semiconductor patterns and the electrode structure, and a common source pattern between the source structure. The source structure may include vertical portions along sidewalls of the vertical semiconductor patterns and a horizontal portion laterally extending from the vertical portions and below the electrode structure. Lower portions of the vertical portions may be connected to the common source pattern.

BRIEF DESCRIPTION OF THE DRAWINGS

FIGS. 6 to 15 are cross-sectional views taken along line I-I' of FIG. 2, illustrating a method of manufacturing a three-dimensional semiconductor memory device according to example embodiments.

FIG. 16 is a cross-sectional view illustrating a three-dimensional semiconductor memory device according to example embodiments.

FIGS. 17 to 25 are cross-sectional views taken along line I-I' of FIG. 2, illustrating a method of manufacturing a three-dimensional semiconductor memory device according to example embodiments.

DETAILED DESCRIPTION OF EXAMPLE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
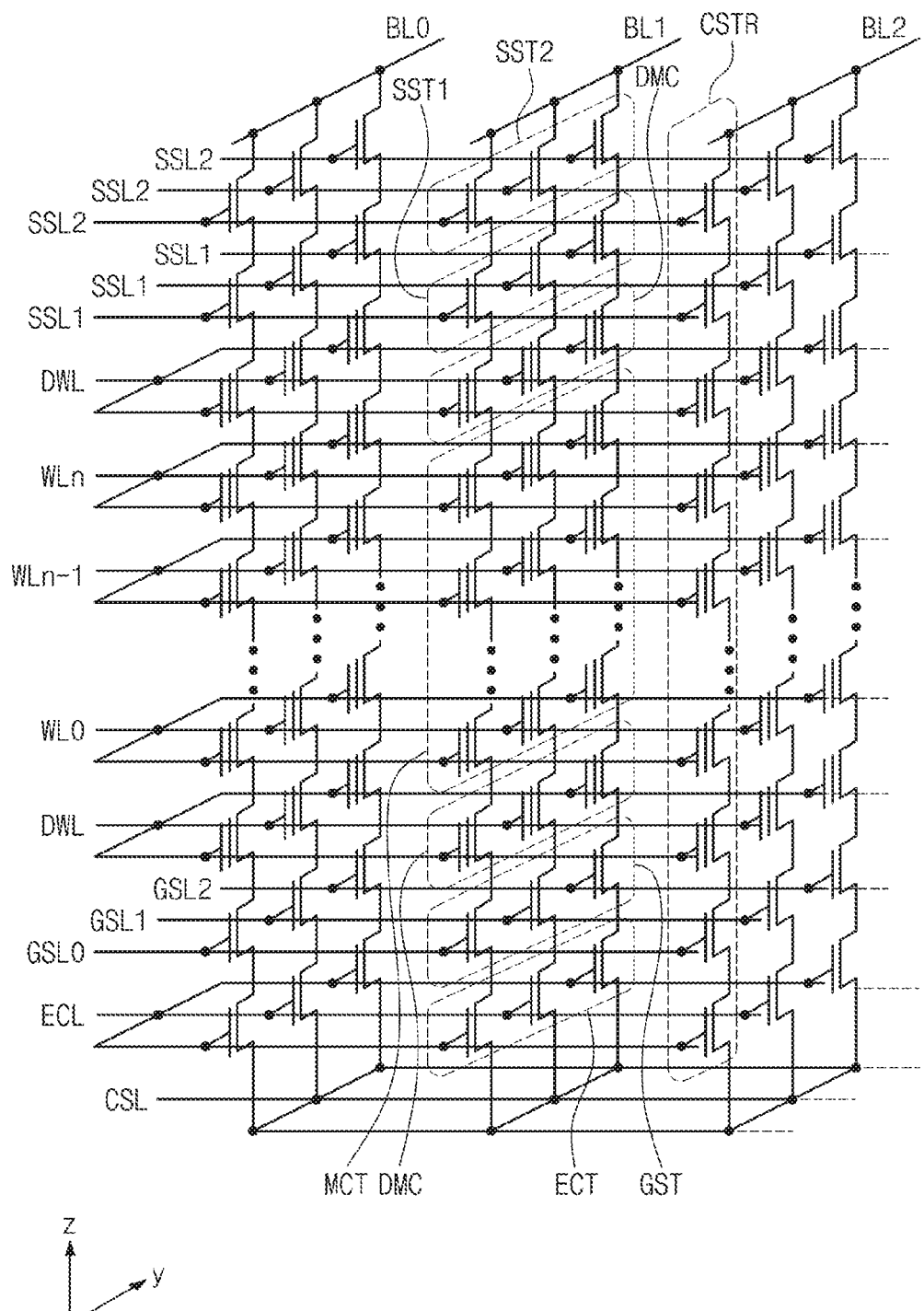
FIG. 1 is a schematic circuit diagram illustrating a cell array of a three-dimensional semiconductor memory device according to example embodiments.

FIG. 1 is a schematic circuit diagram illustrating a cell array of a three-dimensional semiconductor memory device according to example embodiments.

Referring to FIG. 1, a three-dimensional (3D) semiconductor memory device may include a common source line CSL, a plurality of bit lines BL0-BL2, and/or a plurality of cell strings CSTR between the common source line CSL and the bit lines BL0-BL2. The plurality of cell strings CSTR may be connected in parallel to each of the bit lines BL0-BL2. The cell strings CSTR may be connected in common to the common source line CSL. For example, the cell strings CSL may be disposed between the bit lines BL0-BL2 and one common source line CSL. In some embodiments, the common source line CSL may include a plurality of common source lines arranged in two dimensions. In some embodiments, a same electrical voltage may be applied to the common source lines CSL, or each of the common source lines CSL may be independently controlled.

Each of the cell strings CSTR may include string select transistors SST1 and SST2, memory cell transistors MCT, a ground select transistor GST, and/or an erase control transistor ECT that are connected in series. Each of the memory cell transistors MCR may include a data storage element. In some embodiments, each of the cell strings CSTR may include first and second string select transistors SST1 and SST2 connected in series, and the second string select transistor SST2 may be connected to a corresponding one of the bit lines BL0-BL2. In other embodiments, each of the cell strings CSTR may include one string select transistor. In some embodiments, the ground select transistor GST of each of the cell strings CSTR may include a plurality of MOS transistors connected in series, similar to the first and second string select transistors SST1 and SST2.

The memory cell transistors MCT of each of the cell strings CSTR may be positioned at different distances from the common source line CSL. The memory cell transistors MCT may be connected in series between the first string select transistor SST1 and the ground select transistor GST. The erase control transistor ECT of each of the cell strings CSTR may be connected between the ground select transistor GST and the common source line CSL. In some embodiments, each of the cell strings CSTR may include dummy cells DMC connected between the first string select transistor SST1 and an adjacent one of the memory cell transistors MCT and/or between the ground select transistor GST and an adjacent one of the memory cell transistors MCT.

The first string select transistor SST1 may be controlled by a first string select line SSL1. The second string select transistor SST2 may be controlled by a second string select line SSL2. The memory cell transistors MCT may be controlled by a plurality of word lines WL0-WLn. Each of the dummy cells DMC may be controlled by a dummy word line DWL. In addition, the ground select transistor GST may be controlled by a ground select line GSL. The erase control transistor ECT may be controlled by an erase control line ECL. The common source line CSL may be connected in common to sources of the erase control transistors ECT of respective ones of the cell strings CSTR.

Gate electrodes of the memory cell transistors MCT, positioned at substantially the same distance from the common source line CSL, may be connected in common to one of the word lines WL0-WLn, and DWL, and thus may be in an equal electric potential state. In some embodiments, although the gate electrodes of the memory cell transistors MCT are positioned at substantially the same level from the common source line CSL, the gate electrodes disposed in different rows or columns may be independently controlled.

The ground select lines GSL0-GSL2 and the string select lines SSL1 and SSL2 may extend in an x direction and may be spaced apart from each other in a y direction. The ground select lines GSL0-GSL2 positioned at substantially the same level from the common source line CSL may be electrically separated from each other, and the string select transistors SSL1 or SSL2 positioned at substantially the same level from the common source line CSL may be electrically separated from each other. In addition, the erase control transistors ECT of the respective cell strings CSTR may be controlled by the common erase control line ECL. The erase control transistors ECT may generate a gate induced drain leakage (GIDL) current during an erase operation of the memory cell array.

Figure 2:
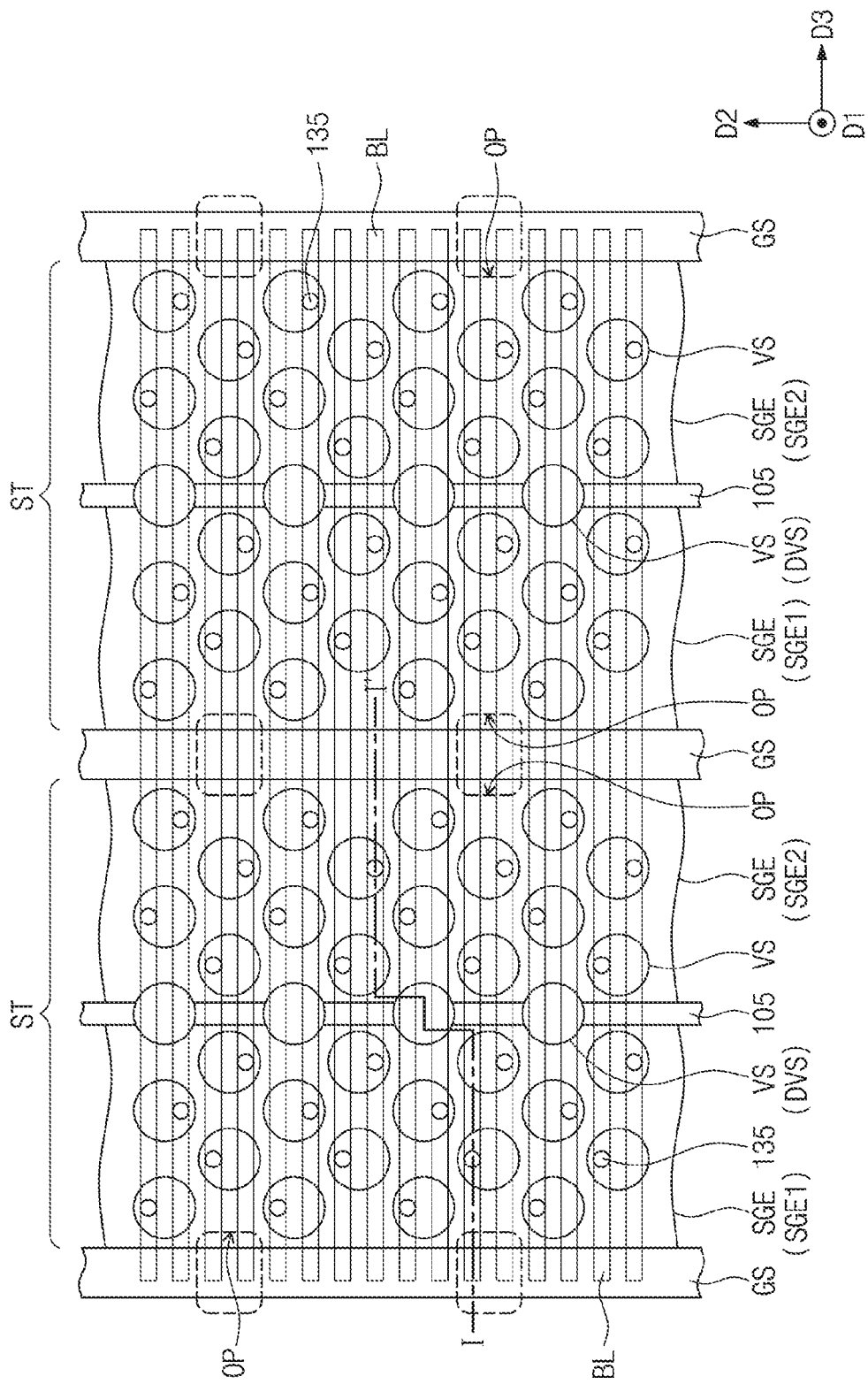
FIG. 2 is a plan view illustrating a three-dimensional semiconductor memory device according to example embodiments.
Figure 3:
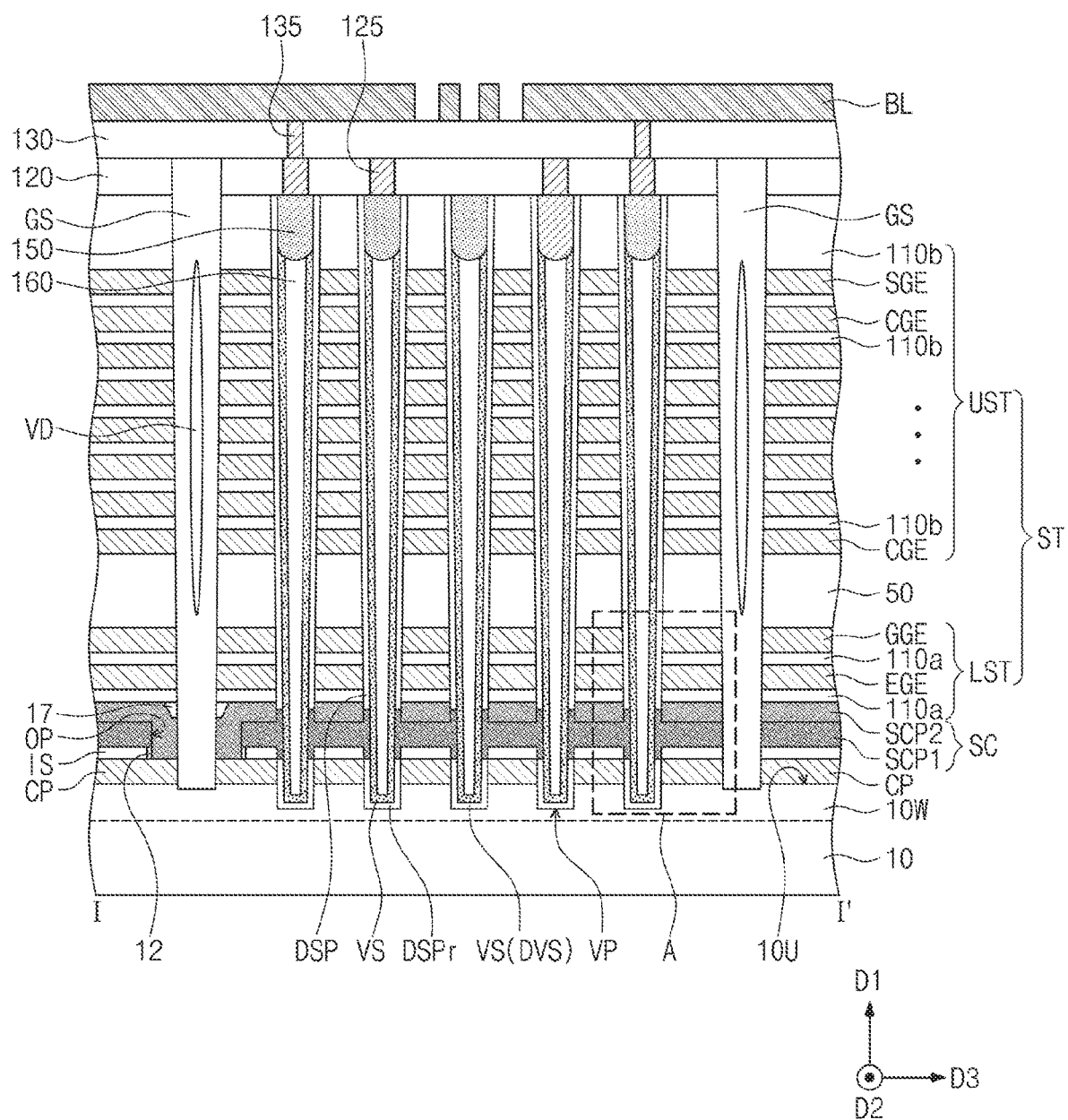
FIG. 3 is a cross-sectional view taken along line I-I' of FIG. 2.
Figure 4:
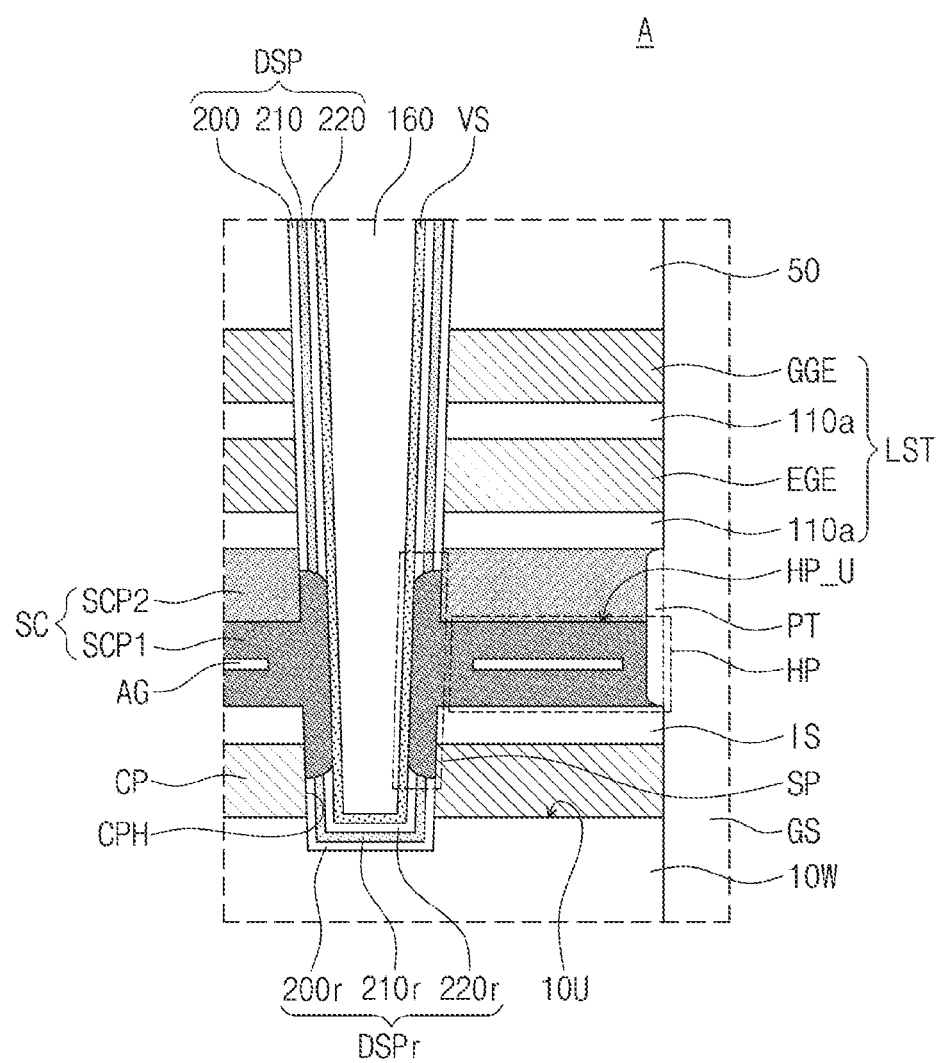
FIGS. 4 and 5 are enlarged views of portion A of FIG. 3.
Figure 5:
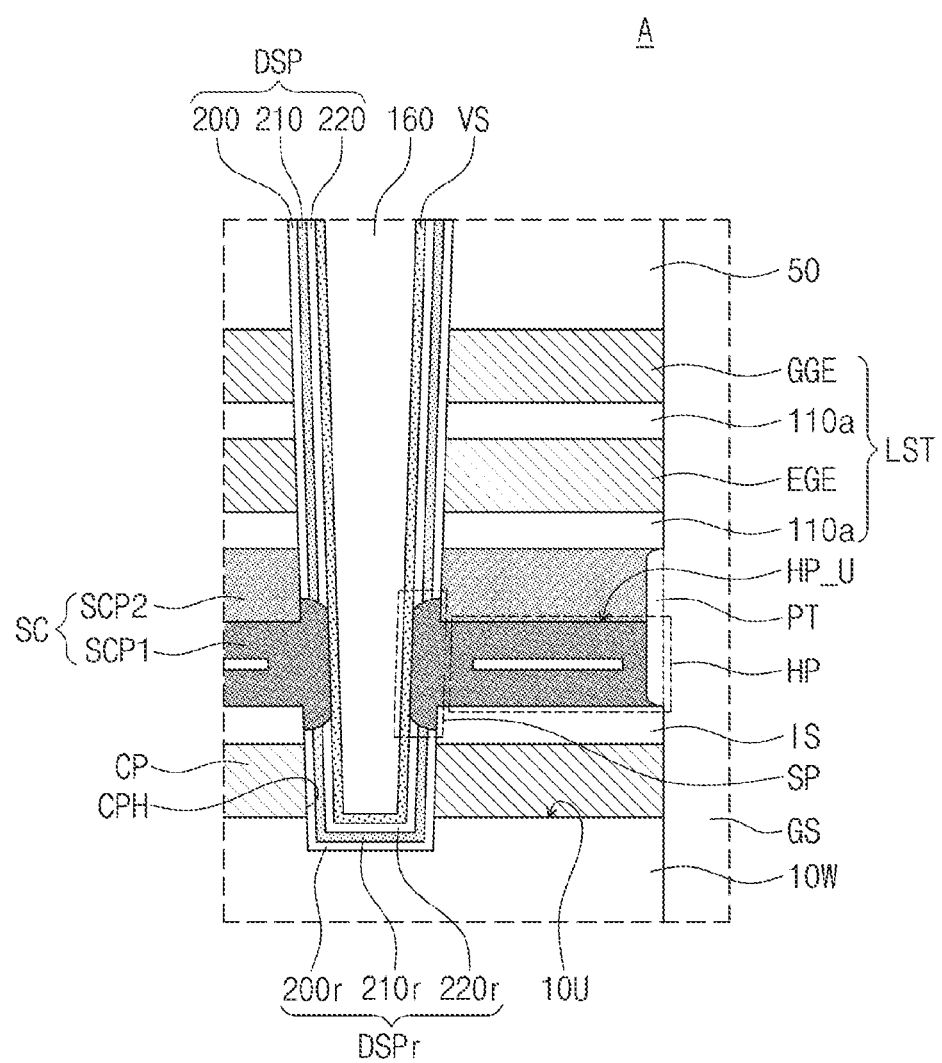

FIG. 2 is a plan view illustrating a three-dimensional semiconductor memory device according to example embodiments. FIG. 3 is a cross-sectional view taken along line I-I' of FIG. 2. FIGS. 4 and 5 are enlarged views of portion A of FIG. 3.

Referring to FIGS. 2 to 5, a source structure SC and an electrode structure ST may be disposed on a substrate 10. The substrate 10 may be a semiconductor substrate (e.g., a silicon substrate, a germanium substrate, or a silicon-germanium substrate). A well region 10W may be disposed in the substrate 10. The substrate 10 may have a first conductivity type. The well region 10W may include an impurity of a second conductivity type different from the first conductivity type. For example, the first conductivity type may be a P-type, and the second conductivity type may be an N-type. In this case, the well region 10W may include an N-type impurity (e.g., phosphorus or arsenic). In some embodiments, the well region 10W may be omitted.

The source structure SC may be interposed between the substrate 10 and the electrode structure ST. The source structure SC and the electrode structure ST may be sequentially stacked on the substrate 10 in a first direction D1 perpendicular to an upper surface 10U of the substrate 10. The electrode structure ST may extend in a second direction D2 parallel to the upper surface 10U of the substrate 10. The source structure SC may extend in the second direction D2 below the electrode structure SC. The source structure SC may include a first source conductive pattern SCP1 and a second source conductive pattern SCP2 that are sequentially stacked on the substrate 10. The first and second source conductive patterns SCP1 and SCP2 may include a semiconductor material doped with an impurity of the second conductivity type. A concentration of the impurity in the first source conductive pattern SCP1 may be greater than that in the second source conductive pattern SCP2. As an example, the first and second source conductive patterns SCP1 and SCP2 may include polysilicon doped with the N-type impurity (e.g., phosphorus, or arsenic). A concentration of the N-type impurity may be greater in the first source conductive pattern SCP1 than in the second source conductive pattern SCP2.

The first source conductive pattern SCP1 may have recessed sidewalls OP. Each of the recessed sidewalls OP may be concave toward the inside of the first source conductive pattern SCP1. The first source conductive pattern SCP1 may have at least a pair of recessed sidewalls OP opposite to each other in a third direction D3 crossing the second direction D2 and parallel to the upper surface 10U of the substrate 10. The first source conductive pattern SCP1 may include a horizontal portion HP extending substantially parallel to the upper surface 10U of the substrate 10 and vertical portions SP protruding from the horizontal portion HP in the first direction D1 and an opposite direction thereof.

The second source conductive pattern SCP2 may cover an upper surface of the first source conductive pattern SCP1 and may extend onto the recessed sidewalls OP of the first source conductive pattern SCP1. A portion of the second source conductive pattern SCP2 may cover the recessed sidewalls OP of the first source conductive pattern SCP1. A separation layer 17 may be disposed on the second source conductive pattern SCP2. The separation layer 17 may be disposed on the portion of the second source conductive pattern SCP2 covering the recessed sidewalls OP of the first source conductive pattern SCP1.

A common source pattern CP may be disposed between the source structure SC and the substrate 10. The common source pattern CP may be electrically connected to the source structure SC. In some embodiments, the common source structure CP may contact the source structure SC in a region adjacent to the recessed sidewalls OP of the first source conductive pattern SCP1, as shown in FIG. 3. The common source pattern CP may constitute a portion of the common source line CSL (refer to FIG. 1), and thus may be a passage through which voltage is applied to the source structure SC.

A source insulation pattern IS may be disposed between the common source pattern CP and the first source conductive pattern SCP1. For example, the source insulation pattern IS may be disposed between the horizontal portion HP of the first source conductive pattern SCP1 and the common source pattern CP. The source insulation pattern IS may include an insulating material, e.g., silicon oxide, silicon nitride, or silicon oxynitride. In some embodiments, the common source pattern CP may be disposed below each electrode structure ST, and may be separated by a gap-fill insulation pattern GS to be described later, but is not limited thereto.

The second source conductive pattern SCP2 may extend along the recessed sidewalls OP of the first source conductive pattern SCP1 and may contact an upper surface of the common source pattern CP. In some embodiments, the second source conductive pattern SCP2 may pass through the source insulation pattern IS. In some embodiments, a buffer insulation layer 12 may be disposed between the second source conductive pattern SCP2 and the source insulation pattern IS. The buffer insulation layer 12 may include, e.g., silicon oxide.

Referring to FIG. 4, lower portions of the vertical portions SP of the first source conductive pattern SCP1 may be connected to the common source pattern CP. For example, the lower portions of the vertical portions SP of the first source conductive pattern SCP1 may be inserted into an upper portion of the common source pattern CP. Lower surfaces of the vertical portions SP of the first source conductive pattern SCP1 is lower than the upper surface of the common source pattern CP. In some embodiments, the common source pattern CP may include source through-holes CPH passing therethrough, and the vertical portions SP of the first source conductive pattern SCP1 may extend into the source through-holes CPH.

In some embodiments, referring to FIG. 5, the vertical portions SP of the first source conductive pattern SCP1 may be spaced apart from the common source pattern CP. The vertical portions SP of the first source conductive pattern SCP1 may respectively extend between the second source pattern SCP2 and a sidewall of each of vertical semiconductor patterns VS to be described later.

The common source pattern CP may contact the substrate 10. For example, the common source pattern CP may contact the well region 10W. In some embodiments, an insulation layer may be disposed between the common source pattern CP and the well region 10W. The common source pattern CP may pass through the insulation layer to be electrically connected to the well region 10W.

The common source pattern CP may include a material having a lower resistivity than the source structure SC. For example, the common source pattern CP may include tungsten, titanium, tantalum, and/or a conductive nitride thereof.

Referring again to FIGS. 2 and 3, the electrode structure ST may include a lower electrode structure LST, an upper electrode structure UST, and/or a planar insulation layer 50 between the lower electrode structure LST and the upper electrode structure UST. The lower electrode structure LST may include lower gate electrodes EGE and GGE and lower insulation layers 110 a that are alternately stacked on the source structure SC along the first direction D1. The upper electrode structure UST may include upper gate electrodes CGE and SGE and upper insulation layers 110 b that are alternately stacked on the planar insulation layer 50 along the first direction D1. The planar insulation layer 50 may be interposed between an uppermost gate electrode GGE of the lower gate electrodes EGE and GGE and a lowermost gate electrode CGE of the upper gate electrodes CGE and SGE. Each of the lower insulation layers 110 a, the upper insulation layers 110 b, and the planar insulation layer 50 may have a thickness in the first direction D1. The thickness of the planar insulation layer 50 may be greater than that of each of the lower and upper insulation layers 110 a and 110 b. The lower and upper insulation layers 110 a and 110 b may have a substantially same thickness, or at least one of the lower and upper insulation layers 110 a and 110 b may be thicker than other of the lower and upper insulation layers 110 a and 110 b. As an example, an uppermost insulation layer 110 b of the lower and upper insulation layers 110 a and 110 b may be thicker than the others of the lower and upper insulation layers 110 a and 110 b. As an example, the source insulation pattern IS may be thinner than each of the lower insulation layers 110 a.

The lower gate electrodes EGE and GGE and the upper gate electrodes CGE and SGE may include a doped semiconductor material (e.g., doped silicon), a metal (e.g., tungsten, copper, or aluminum), a conductive metal nitride (e.g., titanium nitride or tantalum nitride), and/or a transition metal (e.g., titanium or tantalum). The lower insulation layers 110a, the upper insulation layers 110b, and the planar insulation layer 50 may include silicon oxide and/or a low-k dielectric material. In some embodiments, the common source pattern CP and the gate electrodes EGE, GGE, CGE, and SGE may be formed at the same time by a same process, and thus may include a same material. The common source pattern CP may be thicker than each of the lower gate electrodes EGE and GGE.

The lower gate electrodes EGE and GGE may include an erase control gate electrode EGE and a ground select gate electrode GGE on the erase gate electrode EGE. The erase control gate electrode EGE may be adjacent to the source structure SC. A lowermost one of the lower insulation layers 110a may be disposed between the erase control gate electrode EGE and the source structure SC. The erase control gate electrode EGE may be used as a gate electrode of the erase control transistor ECT for controlling the erase operation of the memory cell array shown in FIG. 1. The ground select gate electrode GGE may be used as a gate electrode of the ground select transistor GST shown in FIG. 1. The erase control gate electrode EGE and the ground select gate electrode GGE may extend in the second direction D2.

The upper gate electrodes CGE and SGE may include cell gate electrodes CGE and a string select gate electrode SGE. The cell gate electrodes CGE may be disposed between the ground select gate electrode GGE and the string select gate electrode SGE and may be positioned at different heights from the upper surface 10U of the substrate 10. The cell gate electrodes CGE may be used as gate electrodes of the memory cell transistors MCT shown in FIG. 1. Each of the cell gate electrodes CGE may extend in the second direction D2.

Referring to FIG. 2, the string select gate electrode SGE may include a pair of string select gate electrodes SGE1 and SGE2 that are laterally spaced apart from each other in the third direction D3. The pair of string select gate electrodes SGE1 and SGE2 may be separated from each other by a separation insulation pattern 105 therebetween. The separation insulation pattern 105 may have a linear shape extending in the second direction D2. The separation insulation pattern 105 may include an insulation material (e.g., silicon oxide). The string select gate electrode SGE may be used as a gate electrode of the string select transistor SST2 shown in FIG. 1. In some embodiments, an additional string select gate electrode SGE may be disposed between the string select gate electrode SGE and an uppermost one of the cell gate electrodes CGE. In this case, the additional string select gate electrode SGE may include a pair of additional string select gate electrodes SGE1 and SGE2 spaced apart from each other in the third direction D3, and the additional string select gate electrode SGE and the string select gate electrode SGE may be used as gate electrodes of the string selection transistors SST1 and SST2 shown in FIG. 1.

The vertical semiconductor patterns VS may be disposed on the substrate 10. Each of the vertical semiconductor patterns VS may extend in the first direction D1 to penetrate the electrode structure ST and the source structure SC. The vertical semiconductor patterns VS may pass through the common source pattern CP. As an example, the vertical semiconductor patterns VS may extend into the source through-holes CPH, respectively.

A lower end portion of each of the vertical semiconductor patterns VS may be disposed in the substrate 10 or the well region 10W. The vertical semiconductor patterns VS may be arranged in one direction or in a zigzag form, in plan view. As an example, the vertical semiconductor patterns VS may be arranged in a zigzag form along the second direction, in plan view. Each of the vertical semiconductor patterns VS may have a pipe shape, of which a lower end is closed. The vertical semiconductor patterns VS may include a semiconductor material, such as silicon, germanium, or a compound thereof. The vertical semiconductor patterns VS may include an impurity-doped semiconductor material or an intrinsic semiconductor material undoped with impurities. The vertical semiconductor patterns VS may include a polycrystalline semiconductor material (e.g., polysilicon). The vertical semiconductor patterns VS may be used as channels of the erase control transistor ECT, the string and ground select transistors SST and GST, and the memory cell transistors MCT shown in FIG. 1.

A lower sidewall of each of the vertical semiconductor patterns VS may contact the first source conductive pattern SCP1. Specifically, referring to FIGS. 4 and 5, each of the vertical portions SP of the first source conductive pattern SCP1 may contact a portion of a sidewall of each of the vertical semiconductor patterns VS and may surround the portion of the sidewall of each of the vertical semiconductor patterns VS. The horizontal portion HP of the first source conductive pattern SCP1 may be interposed between the source insulation pattern IS and the second source conductive pattern SCP2. The horizontal portion HP of the first source conductive pattern SCP1 may contact the source insulation pattern IS. In some embodiments, the source insulation pattern IS may be omitted, and thus the horizontal portion HP of the first source conductive pattern SCP1 may contact the common source pattern CP. The horizontal portion HP of the first source conductive pattern SCP1 may include gaps or seams therein. The vertical semiconductor patterns VS may be connected to the common source pattern CP through the source structure SC.

Referring again to FIGS. 2 and 3, the data storage pattern DSP may be interposed between each of the vertical semiconductor patterns VS and the electrode structure ST. The data storage pattern DSP may extend in the first direction D1 and may surround the sidewall of each of the vertical semiconductor patterns VS. The data storage pattern DSP may have a pipe shape, of which an upper end and a lower end are opened. A lower surface of the data storage pattern DSP may contact the first source conductive pattern SCP1.

In an embodiment, referring to FIGS. 4 and 5, the lower surface of the data storage pattern DSP may be positioned at a height lower than a lower surface of the erase control gate electrode EGE and may contact each of the vertical portions SP of the first source conductive pattern SCP1. As used herein, the term "height" means a distance vertically measured from the upper surface 10U of the substrate 10. In some embodiments, the lower surface of the data storage pattern DSP may be interposed between the sidewall of each of the vertical semiconductor patterns VS and the second source conductive pattern SCP2. The lower surface of the data storage pattern DSP may be positioned at a height higher than an upper surface HP_U of the horizontal portion HP of the first source conductive pattern SCP1.

The data storage pattern DSP may be a data storage layer of a NAND flash memory device. The data storage pattern DSP may include a first insulation pattern 210 between each of the vertical semiconductor patterns VS and the electrode structure ST, a second insulation pattern 200 between the first insulation pattern 210 and the electrode structure ST, and a third insulation pattern 220 between each of the vertical semiconductor patterns VS and the first insulation pattern 210. The first insulation pattern 210 may be a charge storage layer, e.g., a trap insulation layer, an insulation layer including conductive nano dots, or a floating gate electrode. As an example, the first insulation pattern 210 may include at least one of silicon nitride, silicon oxynitride, silicon-rich nitride, nanocrystalline silicon, and a laminated trap layer. The second insulation pattern 200 may include a material having a band gap greater than the first insulation pattern 210. The second insulation pattern 200 may be a blocking layer and may include a high-k dielectric material, e.g., aluminum oxide or hafnium oxide. The third insulation pattern 220 may include a material having a band gap greater than the first insulation pattern 210. The third insulation pattern 220 may be a tunnel insulation layer and may include, e.g., silicon oxide or a high-k dielectric material.

A dummy data storage pattern DSPr may be disposed between each of the vertical semiconductor patterns VS and the substrate 10 or the well region 10W. At least a portion of the dummy data storage pattern DSPr may be disposed in the substrate 10 or the well region 10W. Each of the vertical semiconductor patterns VS may be isolated from the substrate 10 or the well region 10W by the dummy data storage pattern DSPr. The dummy data storage pattern DSPr may extend onto the sidewall of each of the vertical semiconductor patterns VS. The dummy data storage pattern DSPr may have a U-shaped cross-section. The data storage pattern DSP may be spaced apart from the dummy data storage pattern DSPr with the vertical portion SP of the first source conductive pattern SCP1 therebetween.

An uppermost surface of the dummy data storage pattern DSPr may be higher than a lower surface of the common source pattern CP. As an example, the uppermost surface of the dummy data storage pattern DSPr may be disposed between an upper surface and the lower surface, of the common source pattern CP. The uppermost surface of the dummy data storage pattern DSPr may contact each of the vertical portions SP of the first source conductive pattern SCP1. The dummy data storage pattern DSPr may have substantially the same multilayered structure as the data storage pattern DSP. For example, the dummy data storage pattern DSPr may include a first dummy insulation pattern 210r, a second dummy insulation pattern 200r between the first dummy insulation pattern 210r and the substrate 10 or the well region 10W, and a third dummy insulation pattern 220r between the first dummy insulation pattern 210r and each of the vertical semiconductor patterns VS. The first dummy insulation pattern 210r, the second dummy insulation pattern 200r, and the third dummy insulation pattern 220r may respectively include the same material as the first insulation pattern 210, the second insulation pattern 200, and the third insulation pattern 220.

Referring again to FIGS. 2 and 3, a buried insulation pattern 160 may fill the inside of each of the vertical semiconductor patterns VS. The buried insulation pattern 160 may include, e.g., silicon oxide. A conductive pad 150 may be disposed on each of the vertical semiconductor patterns VS. The conductive pad 150 may cover an upper surface of the buried insulation pattern 160 and an uppermost surface of each of the vertical semiconductor patterns VS. The conductive pad 150 may include an impurity-doped semiconductor material and/or a conductive material. Hereinafter, a structure including the vertical semiconductor pattern VS, the data storage pattern DSP, and the buried insulation pattern 160 refers to a vertical structure VP.

A plurality of electrode structures ST may be disposed spaced apart from each other by gap-fill insulation patterns GS in the third direction D3. Each of the gap-fill insulation patterns GS may extend in the second direction D2. The gap-fill insulation patterns GS may be disposed on opposite sides of the source structure SC and may be spaced apart from each other with the source structure SC therebetween. The gap-fill insulation patterns GS may include at least one of silicon oxide, silicon nitride, and silicon oxynitride. Each of the gap-fill insulation patterns GS may include a void VD that is free of a solid phase material therein, but is not limited thereto. The void VD may extend in the second direction D2. As shown in FIGS. 4 and 5, each of the gap-fill insulation patterns GS may include a protrusion portion PT protruding toward the source structure SC. Each of the gap-fill insulation patterns GS may not include a conductive layer connected to the substrate 10 and/or the well region 10W.

A capping insulation layer 120 may be disposed on the electrode structure ST and may cover an upper surface of the electrode structure ST and an upper surface of the conductive pad 150. An interlayer insulation layer 130 may be disposed on the capping insulation layer 120 and may cover upper surfaces of the gap-fill insulation patterns GS. The capping insulation layer 120 and the interlayer insulation layer 130 may include an insulation material (e.g., silicon oxide). A first contact 125 may be disposed on the conductive pad 150. The first contact 125 may pass through the capping insulation layer 120 to be connected to the conductive pad 150. A second contact 135 may pass through the interlayer insulation layer 130 to be connected to the first contact 125. The first contact 125 and the second contact 135 may include a conductive material (e.g., tungsten). Bit lines BL may be disposed on the interlayer insulation layer 130. The bit lines BL may extend in the third direction D3 and may be spaced apart from each other in the second direction D2. The vertical semiconductor patterns VS may include a dummy vertical semiconductor pattern DVS unconnected to the first contact 125 or the second contact 135. Each of the vertical semiconductor patterns VS except for the dummy vertical semiconductor pattern DVS may be electrically connected to a corresponding one of the bit lines BL through the first contact 125 and the second contact 135. The bit lines BL may include a conductive material. Referring to FIG. 1, as the erase voltage is applied to the source structure SC in the erase operation of the memory cell array, the gate induced drain leakage (GIDL) current may be generated in the erase control transistor ECT. Thus, the erase operation may be performed on the memory cells.

According to example embodiments, the common source pattern CP that is a part of the common source line for applying a voltage to the source structure SC may be disposed between the substrate 10 and the source structure SC. Thus, due to the common source pattern CP according to example embodiments, a distance (e.g., a width of the gap-fill insulation pattern GS) between the electrode structures ST may be reduced compared to a device including a structure in which the common source pattern is disposed between the electrode structures ST.

FIGS. 6 to 15 are cross-sectional views taken along line I-I' of FIG. 2, illustrating a method of manufacturing a three-dimensional semiconductor memory device according to example embodiments.

Referring to FIGS. 2 and 6, a source sacrificial layer LL may be formed on the substrate 10. The substrate 10 may be a semiconductor substrate (e.g., a silicon substrate, a germanium substrate, or a silicon-germanium substrate). The source sacrificial layer LL may be formed of the same material as lower sacrificial layers LSL and upper sacrificial layers USL (refer to FIG. 8) to be described later. For example, the source sacrificial layer LL may include silicon nitride.

The source insulation pattern IS and a lower sacrificial pattern LSP may be formed on the source sacrificial layer LL. The formation of the source insulation pattern IS and the lower sacrificial pattern LSP may include forming an opening 250 passing through the source insulation pattern IS and the lower sacrificial pattern LSP. The opening 250 may have a linear shape extending in the second direction D2. The lower sacrificial pattern LSP may include at least one of silicon nitride, silicon oxynitride, silicon carbide, and silicon germanium.

Referring FIGS. 2 and 7, a buffer insulation layer 12 and a source conductive layer SCP may be sequentially formed on the lower sacrificial pattern LSP. The buffer insulation layer 12 may be formed to cover an upper surface of the lower sacrificial pattern LSP and an inner surface of the opening 250 with a uniform thickness. The source conductive layer SCP may fill the opening 250 and may extend to cover the upper surface of the lower sacrificial pattern LSP. The upper surface of the source conductive layer SCP may include a surface 255 recessed toward the opening 250. The buffer insulation layer 12 may include, e.g., silicon oxide. The source conductive layer SCP may include, e.g., a polysilicon layer doped with an N-type impurity.

A separation layer 17 may be formed to cover the recessed surface 255 of the source conductive layer SCP. The formation of the separation layer 17 may include forming an insulation layer on the source conductive layer SCP and planarizing the insulation layer to expose the upper surface of the source conductive layer SCP. The separation layer 17 may include, e.g., silicon oxide.

Figure 8:
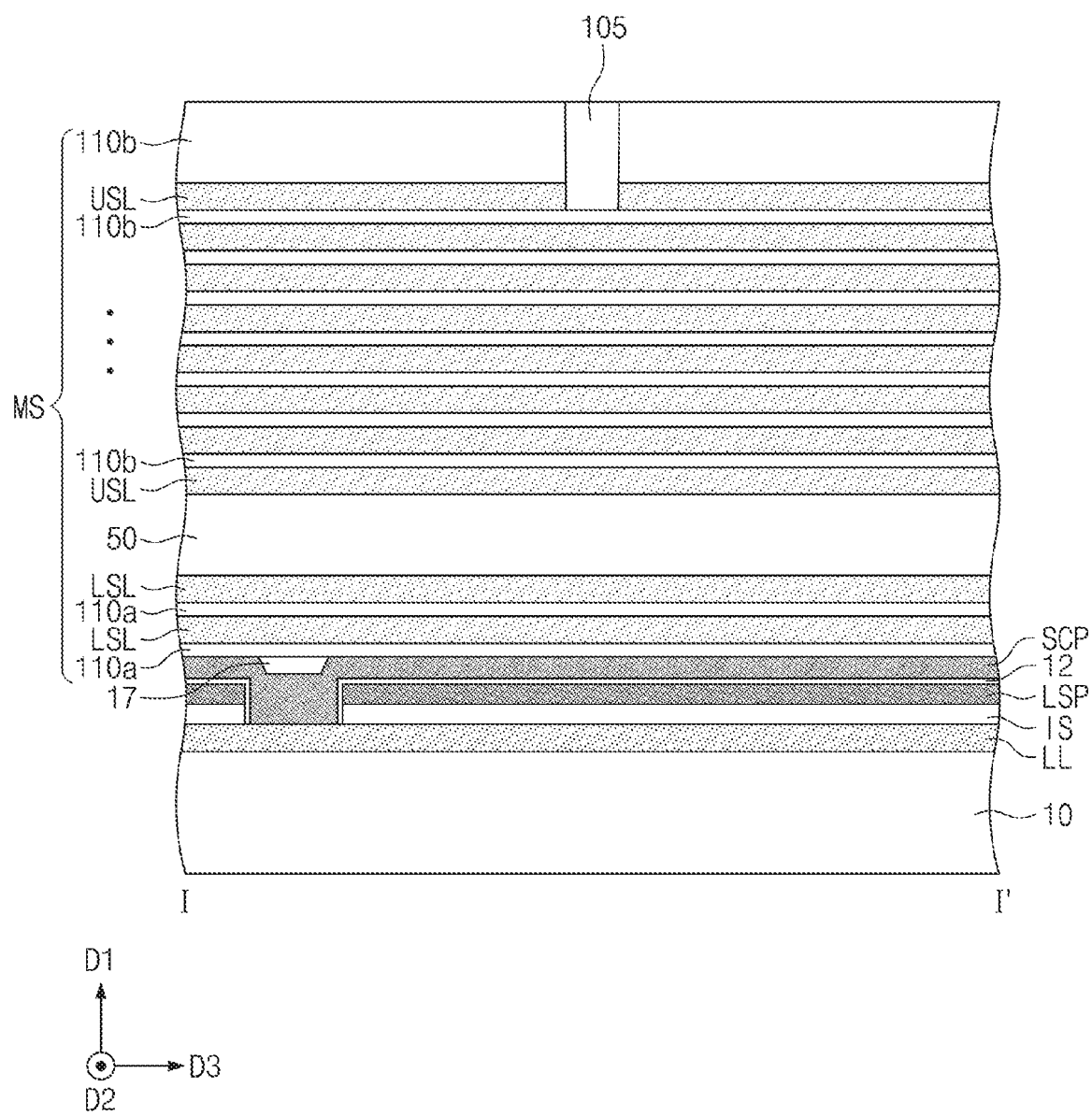

Referring to FIGS. 2 and 8, the lower insulation layers 110a and the lower sacrificial layers LSL may be alternately stacked on the source conductive layer SCP. The lower sacrificial layers LSL may include a material having an etch selectivity with respect to the lower insulation layers 110a.

In some embodiments, the lower sacrificial layers LSL may include the same material as the lower sacrificial pattern LSP. The planar insulation layer 50 may be formed on an uppermost one of the lower sacrificial layers LSL. The planar insulation layer 50 may include, e.g., silicon oxide. The upper insulation layers 110*b* and the upper sacrificial layers USL may be alternately stacked on the planar insulation layer 50. The upper sacrificial layers USL may include a material having an etch selectivity with respect to the upper insulation layers 110*b*. In some embodiments, the upper sacrificial layers USL may include the same material as the lower sacrificial layers LSL and the source sacrificial layer LL. As an example, the upper and lower sacrificial layers USL and LSL and the source sacrificial layer LL may include silicon nitride, and the upper and lower insulation layers 110*b* and 110*a* may include silicon oxide. Hereinafter, a structure including the upper and lower sacrificial layers USL and LSL, the upper and lower insulation layers 110*b* and 110*a*, and the planar insulation layer 50 refers to a mold structure MS.

The separation insulation pattern 105 may be formed in the mold structure MS. The separation insulation pattern 105 may formed in an uppermost one of the upper insulation layers 110*b* and an uppermost one of the upper sacrificial layers USL. The separation insulation pattern 105 may separate the uppermost sacrificial layer USL. For example, the uppermost upper sacrificial layer USL may be separated into a pair of upper sacrificial layers USL laterally spaced apart from each other by the separation insulation pattern 105.

Figure 9:
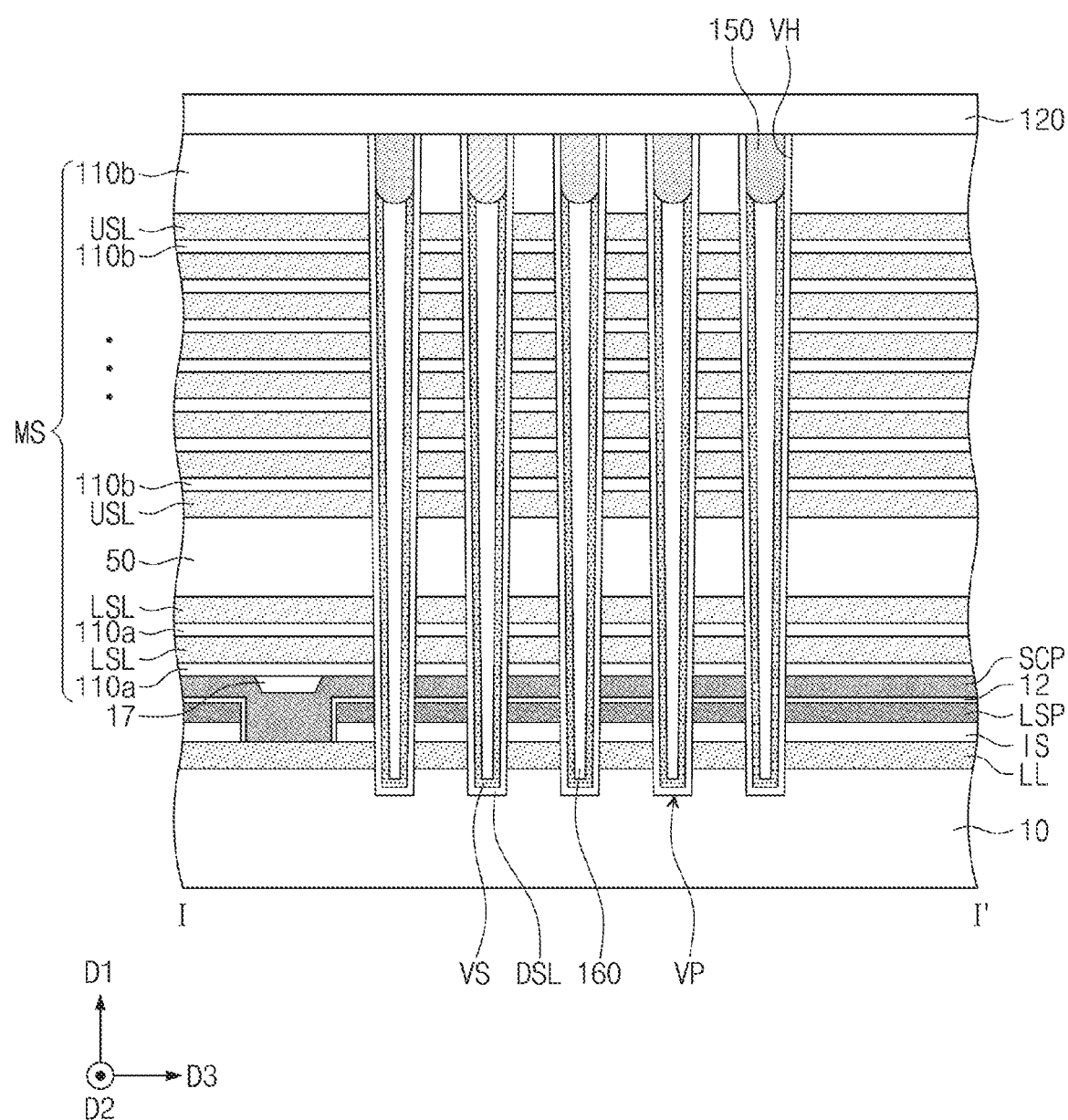

Referring to FIGS. 2 and 9, the vertical structure VP may be formed to penetrate the mold structure MS, the source conductive layer SCP, the buffer insulation layer 12, the lower sacrificial pattern LSP, the source insulation pattern IS, and the source sacrificial layer LL. The formation of the vertical structure VP may include forming a vertical hole VH penetrating the mold structure MS, the source conductive layer SCP, the buffer insulation layer 12, the lower sacrificial pattern LSP, the source insulation pattern IS, and the source sacrificial layer LL to expose the substrate 10 and sequentially forming a data storage layer DSL and the vertical semiconductor pattern VS in the vertical hole VH. The vertical hole VH may extend into the substrate 10. The data storage layer DSL and the vertical semiconductor pattern VS may fill a portion of the vertical hole VH and may cover an inner surface of the vertical hole VH with a uniform thickness. The formation of the vertical structure VP may further include forming the buried insulation pattern 160 to fill a remaining portion of the vertical hole VH after the data storage layer DSL and the vertical semiconductor pattern VS is formed.

The data storage layer DSL may include a blocking insulation layer, a charge storage layer, and a tunnel insulation layer that are sequentially stacked on the inner surface of the vertical hole VH. The vertical semiconductor pattern VS may be formed by depositing a semiconductor layer with a uniform thickness on the data storage layer DSL by chemical vapor deposition or atomic layer deposition and then performing a planarization process. The vertical semiconductor pattern VS may include an impurity-doped semiconductor material or an intrinsic semiconductor material undoped with impurities. The formation of the vertical structure VP may further include forming the conductive pad 150 on a top of the vertical semiconductor pattern VS. After the conductive pad 150 is formed, the capping insulation layer 120 may be formed on the mold structure MS to cover an upper surface of the conductive pad 150.

Figure 10:
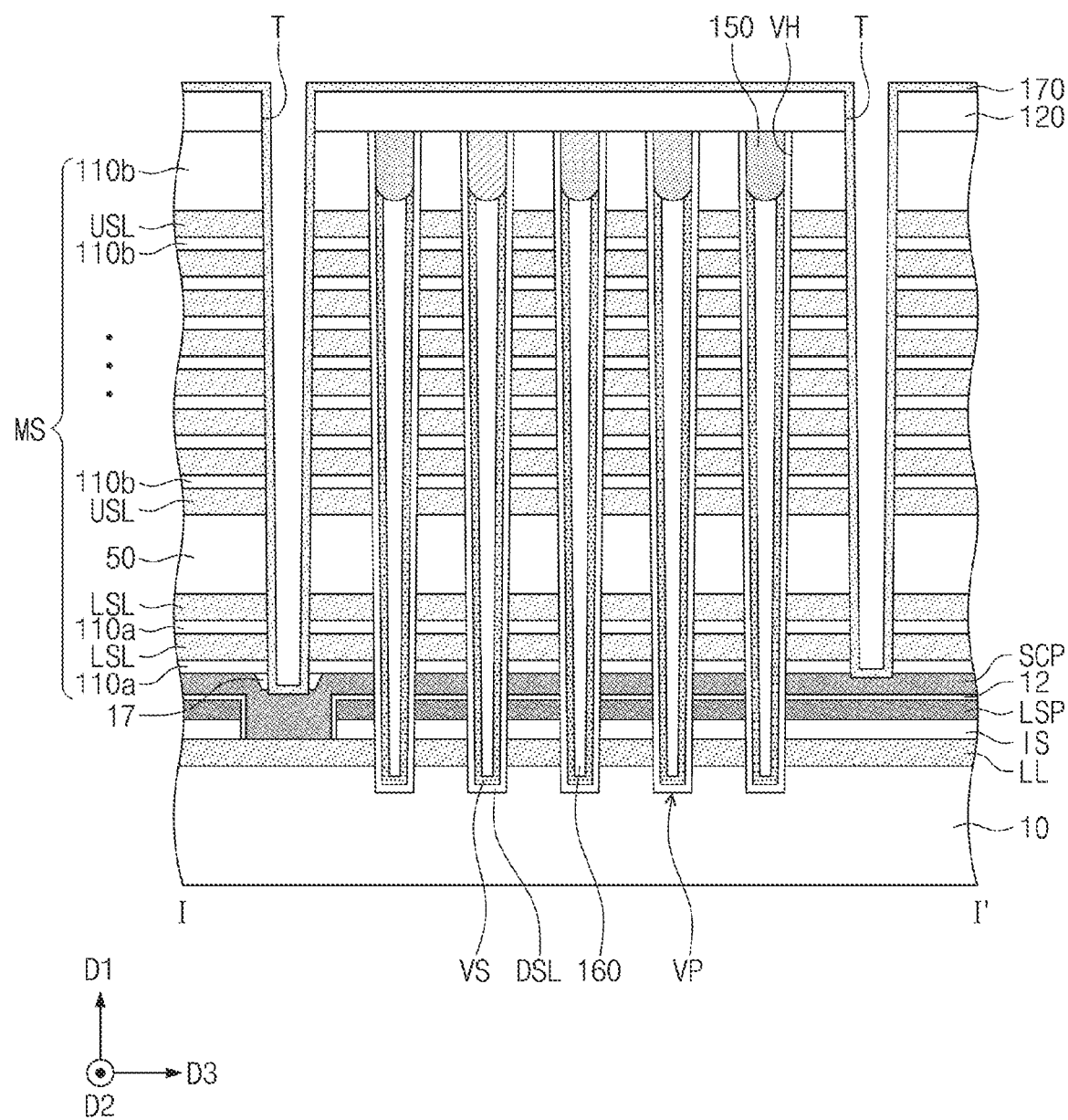

Referring to FIGS. 2 and 10, trenches T may be formed to penetrate the capping insulation layer 120 and the mold structure MS to expose the source conductive layer SCP. At least one of the trenches T may pass through the separation layer 17. The trenches T may extend in the second direction D2 and may be spaced apart from each other in the third direction D3. The trenches T may be laterally spaced apart from the vertical structure VP. A sacrificial spacer layer 170 may be formed on an inner surface of each of the trenches T. The sacrificial spacer layer 170 may be formed to fill a portion of each of the trenches T and to cover the inner surface of each of the trenches T with a uniform thickness. The sacrificial spacer layer 170 may include a material having an etch selectivity with respect to the mold structure MS. For example, the sacrificial spacer layer 170 may include polysilicon.

Figure 11:
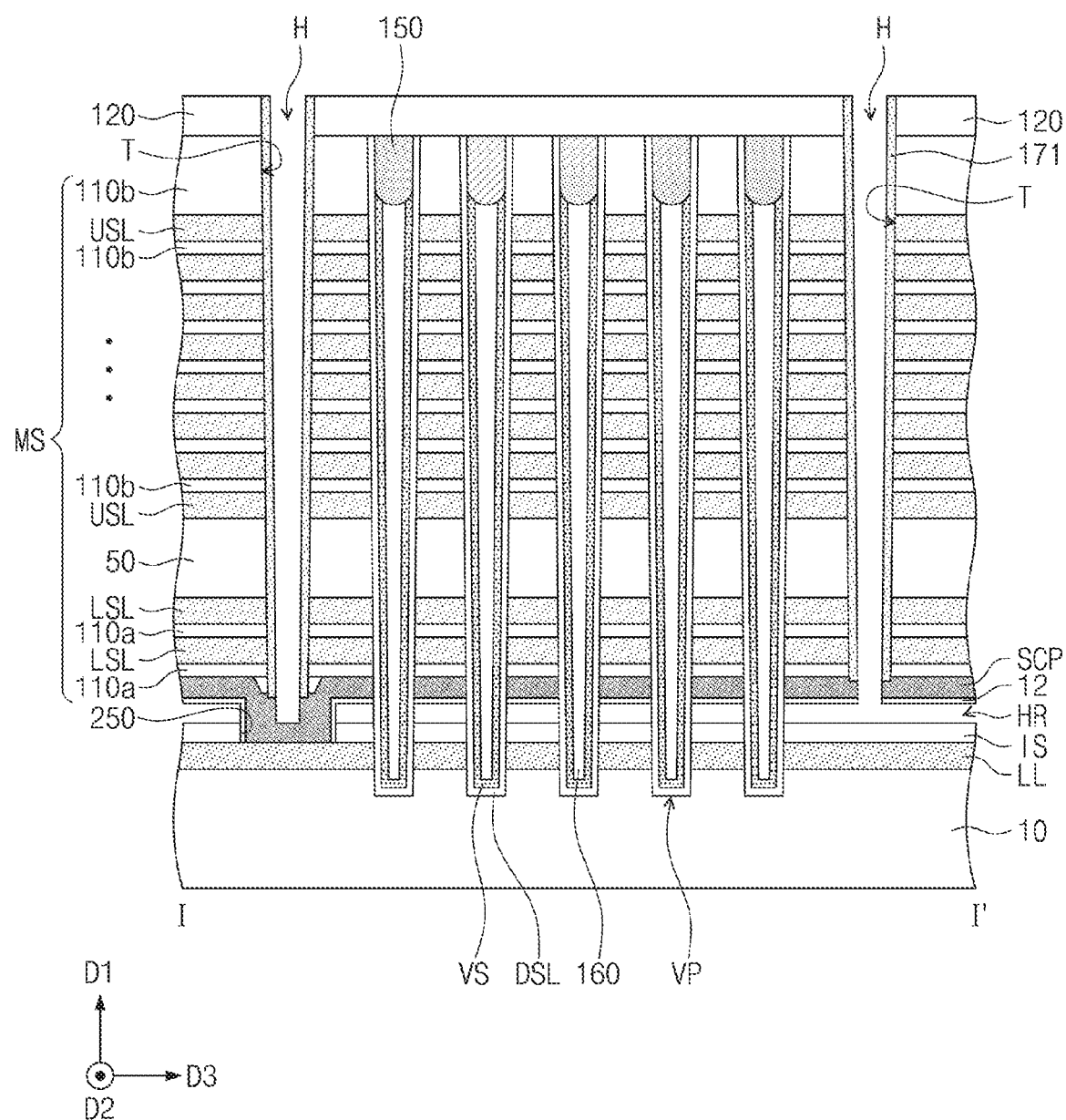

Referring to FIGS. 2 and 11, the sacrificial spacer layer 170 may be anisotropically etched to form a sacrificial spacer 171 on the inner surface of each of the trenches T. When the sacrificial spacer layer 170 is anisotropically etched, a portion of the source conductive layer SCP and a portion of the buffer insulation layer 12 under each of the trenches T may also be etched, such that a through-region H may be formed in each of the trenches T to expose the lower sacrificial pattern LSP. The lower sacrificial pattern LSP exposed by the through-region H may be removed by performing an isotropic etch process, such that a horizontal recess region HR may be formed to expose a portion of the data storage layer DSL. The isotropic etch process may be performed using an etch condition having an etch selectivity with respect to the sacrificial spacer 171, the source conductive layer SCP, the buffer insulation layer 12, and the source insulation pattern IS. The horizontal recess region HR may horizontally extend from the through-region H to between the source conductive layer SCP and the source insulation pattern IS. A portion of the source conductive layer SCP filled in the opening 250 of the lower sacrificial pattern LSP may serve as a support to prevent the mold structure MS from collapsing during the formation of the horizontal recess region HR.

Figure 12:
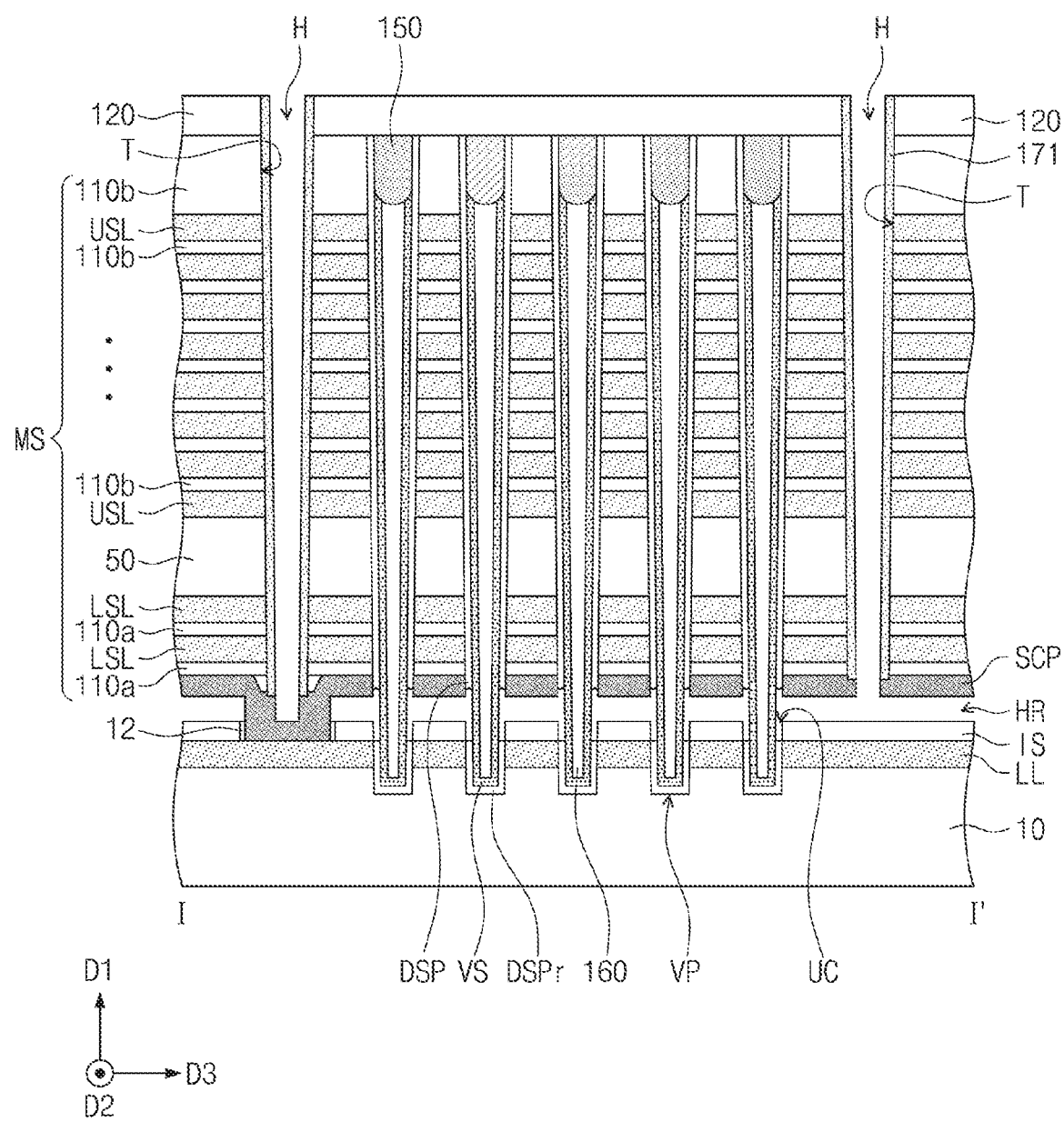

Referring to FIGS. 2 and 12, a portion of the data storage layer DSL exposed by the horizontal recess region HR may be removed to expose a portion of a sidewall of the vertical semiconductor pattern VS. As the portion of the data storage layer DSL is removed, the data storage layer DSL may be divided into the data storage pattern DSP and the dummy data storage pattern DSPr that are vertically spaced apart from each other. The removal of the portion of the data storage layer DSL may performed by an etch process using an etch condition having an etch selectivity with respect to the source conductive layer SCP, the vertical semiconductor pattern VS, and the sacrificial spacer 171. When the portion of the data storage layer DSL is removed, an upper portion of the source insulation pattern IS and a portion of the buffer insulation layer 12 may be removed together, and an undercut region UC may be formed. The undercut region UC may be an empty space extending vertically (e.g., in the first direction D1 and an opposite direction thereto) from the horizontal recess region HR along the sidewall of the vertical semiconductor pattern VS. The undercut region UC may extend between the sidewall of the vertical semiconductor pattern VS and the source conductive layer SCP and between the sidewall of the vertical semiconductor pattern VS and the source insulation pattern IS. The undercut region UC may expose a lower surface of the data storage pattern DSP and an upper surface of the dummy data storage pattern DSPr.

Figure 13:
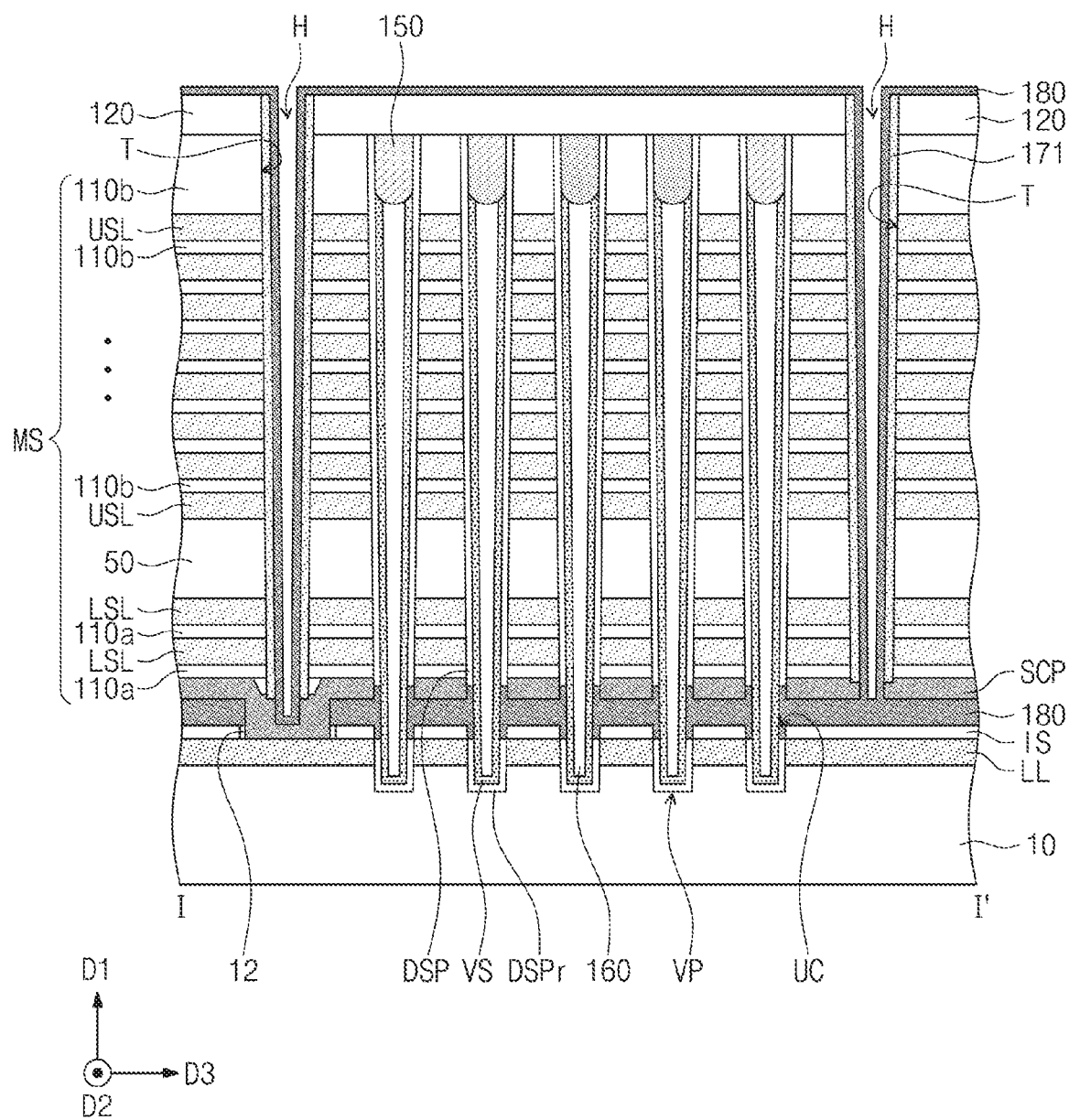

Referring to FIGS. 2 and 13, a sidewall conductive layer 180 may be formed in the undercut region UC, the horizontal recess region HR, and the through-region H. The sidewall conductive layer 180 may be formed by a chemical vapor deposition process or an atomic layer deposition process. The sidewall conductive layer 180 may be an impurity-doped semiconductor layer, e.g., an N-type impurity-doped polysilicon layer. For example, the sidewall conductive layer 180 may be formed using a silicon source (e.g., disilane ($Si_2H_6$), mono silane ($SiH_4$), trisilane ($Si_3H_8$), or chlorosilane (dichlorosilane, trichlorosilane, tetrachlorosilane, or etc.)), or a mixture thereof, along with N-type dopants The sidewall conductive layer 180 may cover inner surfaces of the undercut region UC, the horizontal recess region HR, and the through-region H with a uniform thickness by the deposition process and may not fill completely the through-region H. During the deposition of the sidewall conductive layer 180, the air gaps AG or the seams shown in FIGS. 4 and 5 may be formed in the sidewall conductive layer 180. The sidewall conductive layer 180 may contact the sidewall of the vertical semiconductor pattern VS and an upper surface of the source insulation pattern IS.

Figure 14:
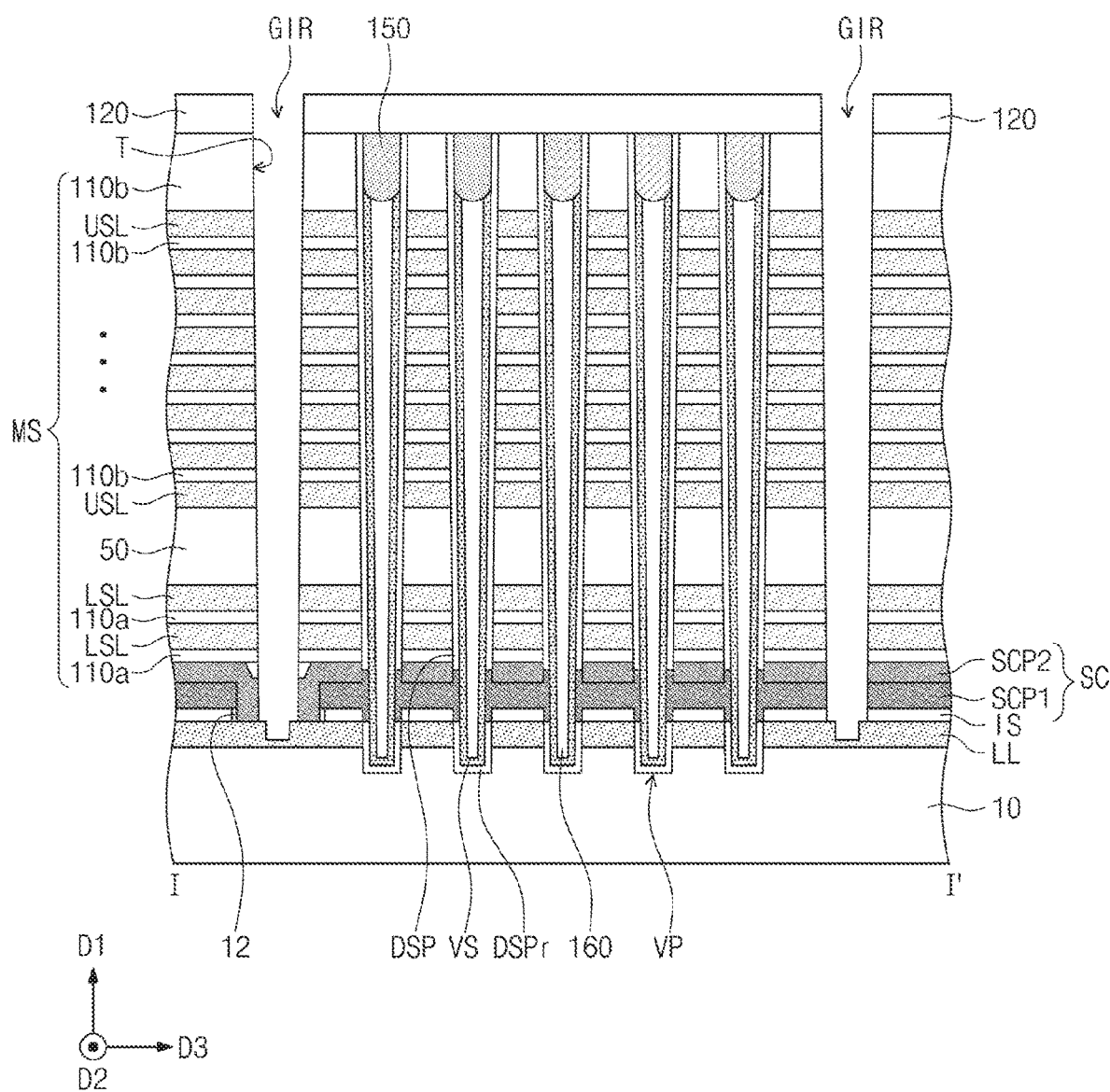

Referring to FIGS. 2 and 14, an isotropic etch process may be performed on the sidewall conductive layer 180 to form the first source conductive pattern SCP1 in the undercut region UC and the horizontal recess region HR. The sacrificial spacer 171 and the sidewall conductive layer 180 may be removed together or separately. Gate separation regions GIR exposing a sidewall of the mold structure MS may be formed between the first source conductive patterns SCP1. The isotropic etch process of etching the sidewall conductive layer 180 and the sacrificial spacer 171 may be performed using an etch condition having an etch selectivity with respect to the mold structure MS. As an example, the isotropic etch process may be a wet etch process using standard clean 1 (SC1) or an ammonium hydroxide ($NH_4OH$) solution.

The source conductive layer SCP may be etched during the isotropic etch of the sidewall conductive layer 180, such that the second source conductive pattern SCP2 may be formed. A structure including the first source conductive pattern SCP1 and the second source conductive pattern SCP2 refers to the source structure SC. The gate separation regions GIR may expose the sidewall of the mold structure MS, a sidewall of the source structure SC, and the source sacrificial layer LL.

Figure 15:
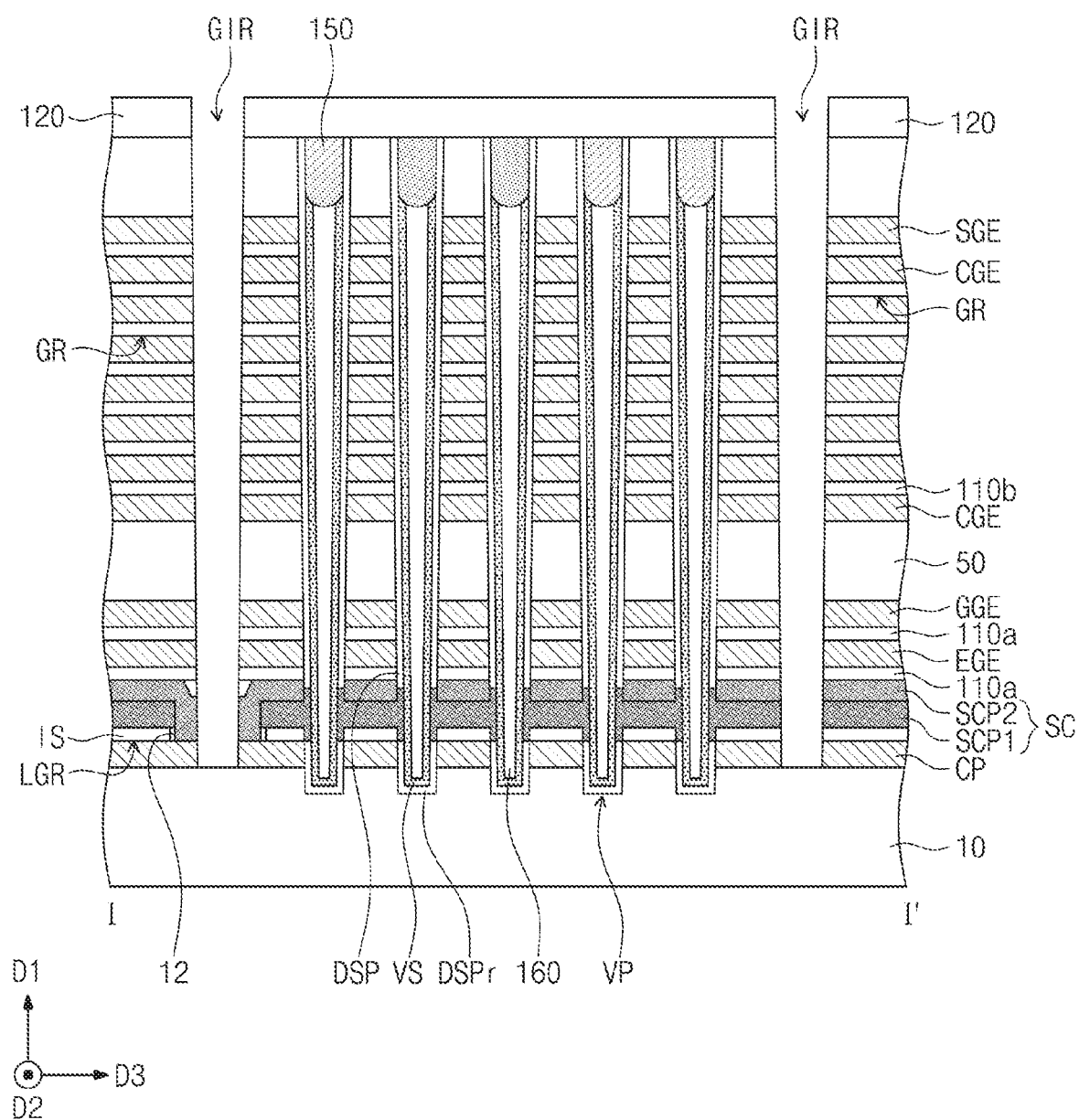

Referring to FIGS. 2 and 15, the lower and upper sacrificial layers LSL and USL and source sacrificial layer LL that are exposed by the gate separation regions GIR may be removed. Thus, gate regions GR may be formed between the lower insulation layers 110a and between the upper insulation layers 110b, and a lower recess region LGR may be formed between the source insulation pattern IS and the substrate 10. The formation of the gate regions GR and the lower recess region LGR may include etching the lower and upper sacrificial layers LSL and USL and the source sacrificial layer LL by performing an isotropic etch process using an etch condition having an etch selectivity with respect to the lower and upper insulation layers 110a and 110b, the data storage pattern DSP, the first and second source conductive patterns SCP1 and SCP2, the source insulation pattern IS, and the substrate 10. Each of the gate regions GR and the lower recess region LGR may horizontally extend from a corresponding one of the gate separation regions GIR and may expose a portion of a sidewall of the data storage pattern DSP. Thereafter, the gate electrodes EGE, GGE, CGE, and SGE and the common source pattern CP may be concurrently formed to fill the gate regions GR and the lower recess region LGR, respectively. The formation of the gate electrodes EGE, GGE, CGE, and SGE and the common source pattern CP may include forming an electrode layer to fill the gate separation regions GIR, the gate regions GR and the lower recess region LGR and removing a portion of the electrode layer in the gate separation regions GIR to locally form the gate electrodes EGE, GGE, CGE, and SGE and the common source pattern CP, for example.

Referring again to FIGS. 2 and 3, the gap-fill insulation patterns GS may be formed in the gate separation regions GIR, respectively. The void VD may be formed in each or some of the gap-fill insulation patterns GS. In some embodiments, the void VD may not be formed in each of the gap-fill insulation patterns GS. The first contact 125 may be formed in the capping insulation layer 120 to be connected to the conductive pad 150. The interlayer insulation layer 130 may be formed on the capping insulation layer 120. The second contact 135 may be formed in the interlayer insulation layer 130 to be connected to the first contact 125. The bit lines BL may be formed on the interlayer insulation layer 130. Accordingly, the three-dimensional semiconductor memory device may be manufactured.

According to example embodiments, the common source pattern CP may be formed with the gate electrodes EGE, GGE, CGE, and SGE at the same time. Therefore, the manufacturing process of the three-dimensional semiconductor memory device may be simplified.

FIG. 16 is a cross-sectional view illustrating a three-dimensional semiconductor memory device according to example embodiments. The same numerals are used to denote the same elements as shown in FIGS. 3 to 5, and thus detailed descriptions thereof are omitted.

Referring to FIG. 16, a three-dimensional semiconductor memory device according to example embodiments may include a peripheral logic structure PS and a cell array structure CS on and the peripheral logic structure PS. The peripheral logic structure PS may include peripheral logic circuits PTR on the substrate 10 and a lower interlayer insulation layer 41 covering the peripheral logic circuits PTR. The substrate 10 may include active regions defined by an isolation layer 13. The peripheral logic circuits PTR may include row and column decoders, a page buffer, and a control circuit. The peripheral logic circuits PTR may include a peripheral gate insulation layer 21 on the substrate 10, a peripheral gate electrode 23 on the peripheral gate insulation layer 21, source/drain regions 25 at opposite sides of the peripheral gate electrode 23.

The peripheral logic structure PS may include peripheral wiring structures 31 and 33 disposed on the substrate 10. Specifically, peripheral circuit wirings 33 may be electrically connected to the peripheral logic circuits PTR through peripheral contact plugs 31. For example, the peripheral contact plugs 31 and the peripheral circuit wirings 33 may be connected to NMOS and PMOS transistors.

The lower interlayer insulation layer 41 may be formed over the substrate 10. The lower interlayer insulation layer 41 may cover the peripheral logic circuits PTR, the peripheral contact plugs 31, and the peripheral circuit wirings 33. The lower interlayer insulation layer 41 may be a multilayered insulation layer. For example, the lower interlayer insulation layer 41 may include a silicon oxide layer, a silicon nitride layer, a silicon oxynitride layer, and/or a low-k dielectric layer.

The cell array structure CS may include the common source pattern CP, the source structure SC, the electrode structures ST, the vertical semiconductor pattern VS, and/or the data storage pattern DSP. The common source pattern CP and the gap-fill insulation pattern GS may contact the lower interlayer insulation layer 41. Lower portions of the vertical structures VP may be inserted into an upper portion of the lower interlayer insulation layer 41.

A through via TV may be disposed to penetrate the gap-fill insulation pattern GS and to connect a wiring CCL of the cell array structure CS and a wiring PPL (e.g., one of the peripheral circuit wirings 33 of) the peripheral logic structure PS. The through via TV may be electrically separated from the source structure SC or the common source pattern CP by the gap-fill insulation pattern GS. The through via TV may include a metal, a conductive metal nitride, or a doped semiconductor material.

FIGS. 17 to 25 are cross-sectional views taken along line I-I' of FIG. 2, illustrating a method of manufacturing a three-dimensional semiconductor memory device according to example embodiments. The same numerals are used to denote the same elements as shown in FIGS. 6 to 15, and thus detailed descriptions thereof are omitted.

Figure 17:
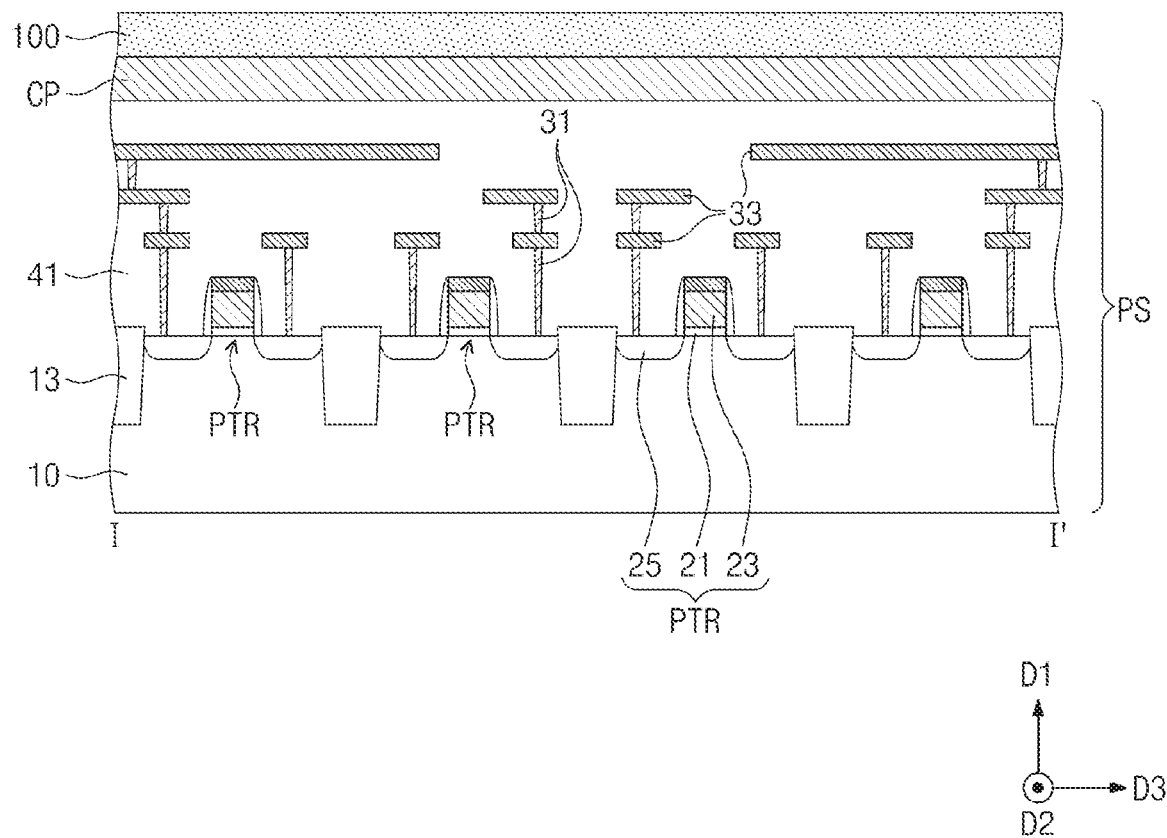

Referring to FIGS. 2 and 17, the peripheral logic structure PS may be formed on the substrate 10. The substrate 10 may be a bulk silicon substrate. The isolation layer 13 defining active regions may be formed in the substrate 10.

The formation of the peripheral logic structure PS may include forming the peripheral logic circuits PTR on the substrate 10, forming the peripheral wiring structures 31 and 33 connected to the peripheral logic circuits PTR, and forming the lower interlayer insulation layer 41. The peripheral logic circuits PTR may include MOS transistors using the substrate 10 as a channel. The formation of the peripheral logic circuits PTR may include forming the isolation layer 13 in the substrate 10 to define the active regions, sequentially forming the peripheral gate insulation layer 21 and the peripheral gate electrode 23 on the substrate 10, and implanting impurities in the substrate 10 at opposite sides of the peripheral gate electrode 23 to form the source/drain regions 25. A peripheral gate spacer may be formed on sidewalls of the peripheral gate electrode 23.

The lower interlayer insulation layer 41 may include a single insulation layer or a plurality of stacked insulation layers to cover the peripheral logic circuits PTR. The lower interlayer insulation layer 41 may include a silicon oxide layer, a silicon nitride layer, a silicon oxynitride layer, and/or a low-k dielectric layer.

The formation of the peripheral wiring structures 31 and 33 may including forming the peripheral contact plugs 31 to penetrate portions of the lower interlayer insulation layer 41 and forming the peripheral circuit wirings 33 to be connected to the peripheral contact plugs 31.

The common source pattern CP and a horizontal semiconductor layer 100 may be sequentially formed on the lower interlayer insulation layer 41. The common source pattern CP may be formed of a material having a resistivity lower than the source structure SC to be described later. For example, the common source pattern CP may include tungsten, titanium, tantalum, and/or a conductive nitride thereof. The horizontal semiconductor layer 100 may be formed of a semiconductor material, such as polysilicon. The horizontal semiconductor layer 100 may include an impurity-doped semiconductor material and/or an intrinsic semiconductor material undoped with impurities. The horizontal semiconductor layer 100 may have at least one of a single-crystalline structure, a polycrystalline structure, and an amorphous structure Referring to FIGS. 2 and 18, a first buffer insulation layer 11a may be formed on 11 the horizontal semiconductor layer 100. The first buffer insulation layer 11a may be formed by oxidizing a surface of the horizontal semiconductor layer 100 or by depositing a silicon oxide layer. The lower sacrificial pattern LSP, the second buffer insulation layer 12, and the source conductive layer SCP may be sequentially formed on the first buffer insulation layer 11a. The separation layer 17 may be formed on the source conductive layer SCP. The mold structure MS may be formed on the source conductive layer SCP. The formation of the lower sacrificial pattern LSP, the second buffer insulation layer 12, the source conducive layer SCP, and the mold structure MS may be substantially the same as that described with reference to FIGS. 7 and 8.

Referring to FIGS. 2 and 19, the vertical structures VP may be formed to penetrate the mold structure MS, the source conducive layer SCP, the second buffer insulation layer 12, the lower sacrificial pattern LSP, and the first buffer insulation layer 11a to be connected to the horizontal semiconductor layer 100. The vertical structures VP may be spaced apart from an upper surface of the common source pattern CP. In some embodiments, the vertical structures VP may contact the upper surface of the common source pattern CP. After the capping insulation layer 120 is formed to cover the vertical structures VP, the trenches T may be formed to penetrate the mold structure MS and to expose the source conductive layer SCP. The sacrificial spacer layer 170 may be formed on inner surfaces of the trenches T.

Referring to FIGS. 2 and 20, the sacrificial spacer layer 170 may be aniostropically etched to form the sacrificial spacer 171 on the inner surface of each of the trenches T. When the sacrificial spacer layer 170 is aniostropically etched, the through region H may be formed to expose the lower sacrificial pattern LSP. By performing an isotropic etch process, the lower sacrificial pattern LSP exposed by the through-region H may be removed to form the horizontal recess region HR.

Figure 21:
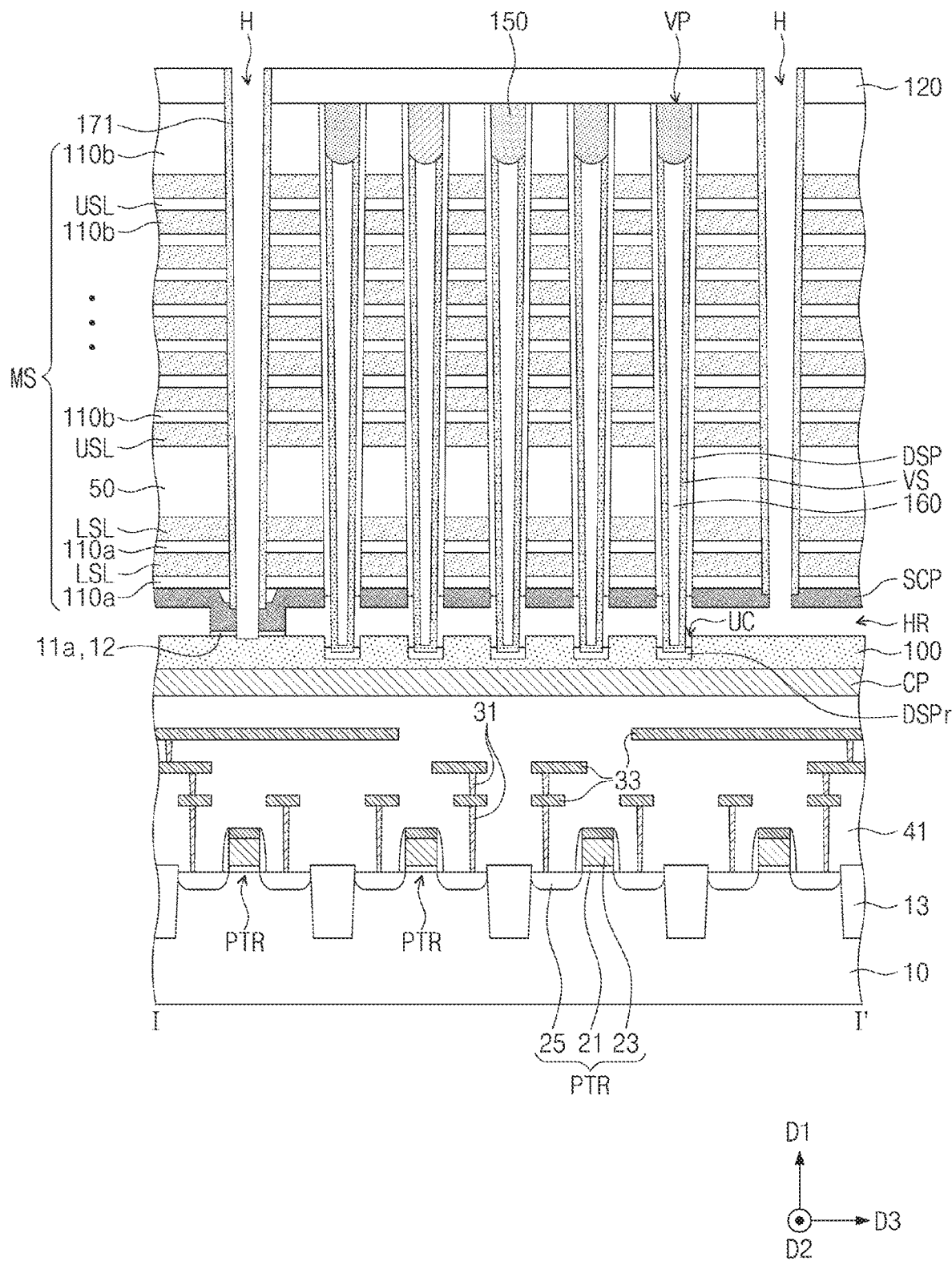

Referring to FIGS. 2 and 21, a portion of the data storage layer DSL exposed by the horizontal recess region HR may be removed, thus exposing a portion of a sidewall of each of the vertical semiconductor patterns VS. As the portion of the data storage layer DSL is removed, the data storage layer DSL may be separated into the data storage pattern DSP and the dummy data storage pattern DSPr, and the undercut region UC may also be formed. At least portions of the first and second buffer insulation layers 11a and 12 may also be removed along with the portion of the data storage layer DSL.

Referring to FIGS. 2 and 22, the sidewall conductive layer 180 may be formed in the undercut region UC, the horizontal recess region HR, and the through-region H. The sidewall conductive layer 180 may contact the sidewall of the semiconductor pattern VS and an upper surface of the horizontal semiconductor layer 100.

Figure 23:
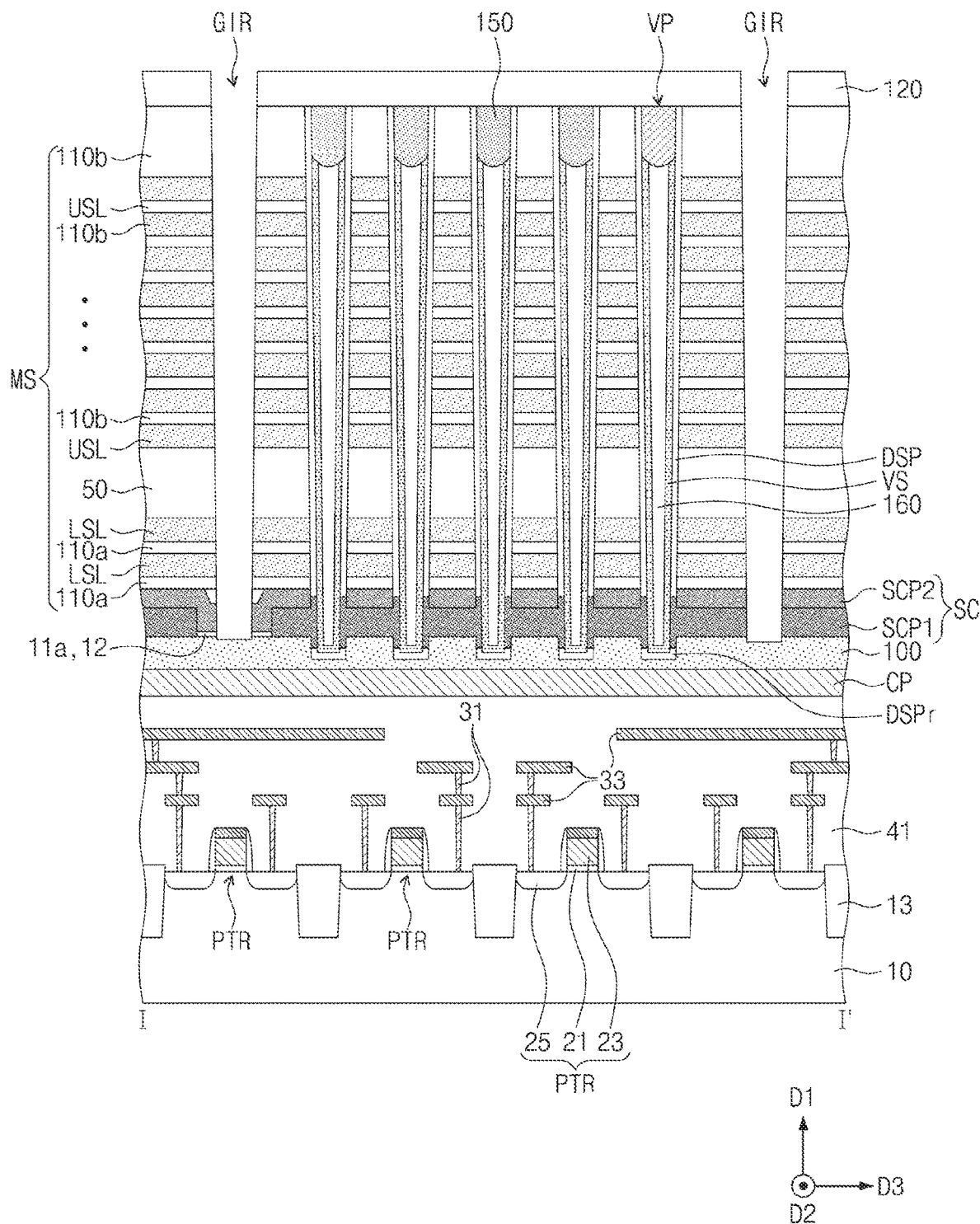

Referring to FIGS. 2 and 23, an isotropic etch process may be performed on the sidewall conductive layer 180 to form the first source conductive pattern SCP1 in the undercut region UC and the horizontal recess region HR. During the isotropic etch of the sidewall conductive layer 180, the source conductive layer SCP may be etched to form the second source conductive pattern SCP2. A structure including the first source conductive pattern SCP1 and the second source conductive pattern SCP2 refers to the source structure SC. By the isotropic etch of the sidewall conductive layer 180, the gate separation regions GIR may be formed. The gate separation regions GIR may expose a sidewall of the mold structure MS, a sidewall of the source structure SC, and the horizontal semiconductor layer 100.

Figure 24:
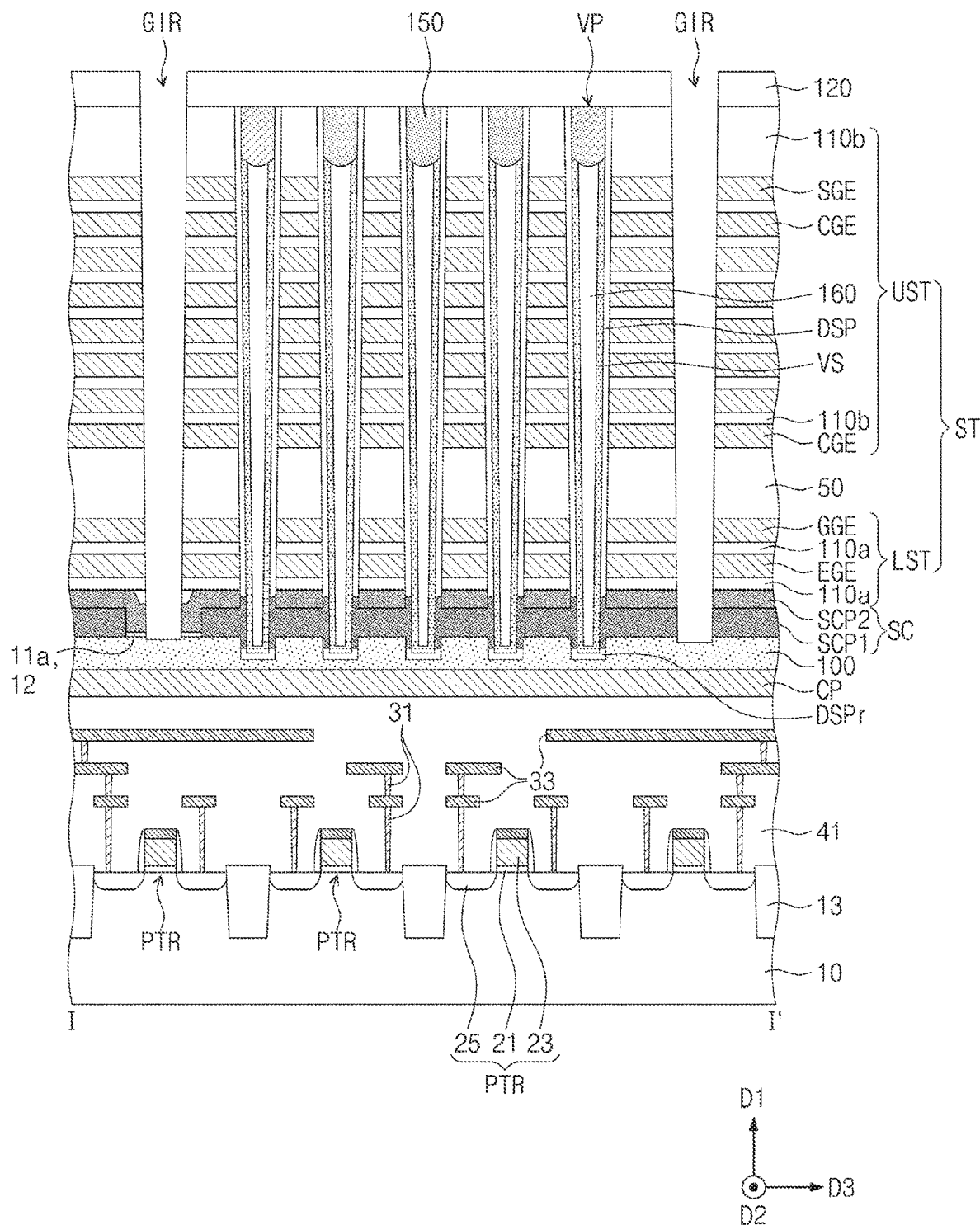

Referring to FIGS. 2 and 24, the lower and upper sacrificial layers LSL and USL exposed by the gate separation regions GIR may be removed. Thus, gate regions may be formed between the lower insulation layers 110a and between the upper insulation layers 110b. The gate electrodes EGE, GGE, CGE, and SGE may be formed to fill the gate regions.

Figure 25:
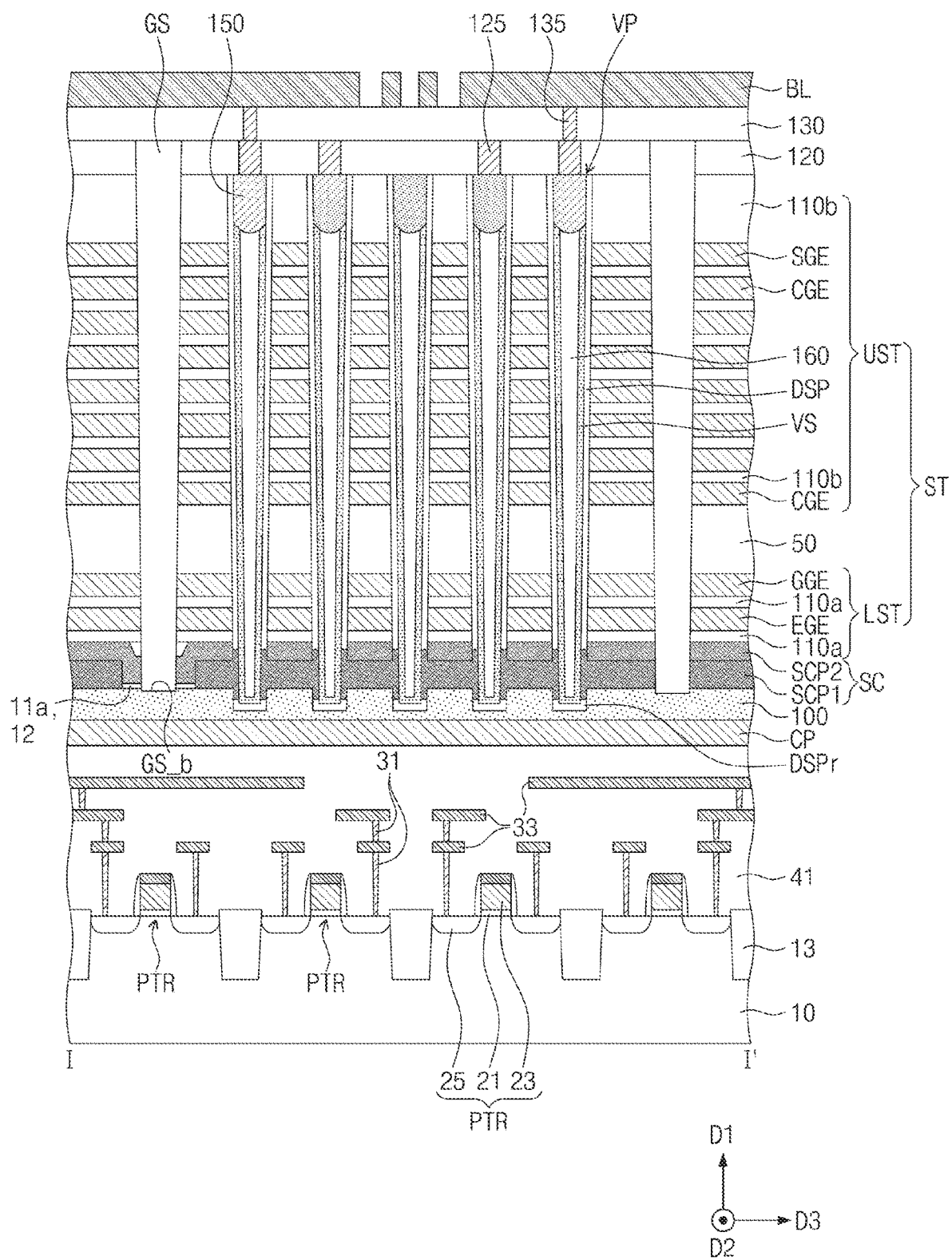

Referring to FIGS. 2 and 25, the gap-fill insulation patterns GS may be formed to fill the gate separation regions GIR, respectively. Lower surfaces GS_b of the gap-fill insulation patterns GS may be higher than an uppermost surface of the common source pattern CP. The lower surfaces GS_b of the gap-fill insulation patterns GS may be spaced apart from the common source pattern CP. The first contact 125 may be formed in the capping insulation layer 120 to be connected to the conductive pad 150. The interlayer insulation layer 130 may be formed on the capping insulation layer 120. The second contact 135 may be formed in the interlayer insulation layer 130 to be connected to the first contact 125. The bit lines BL may be formed on the interlayer insulation layer 130. Accordingly, the three-dimensional semiconductor memory device may be manufactured.

Referring again to FIGS. 2 and 25, in the three-dimensional semiconductor memory device manufactured by the manufacturing method according to example embodiments, lower portions of the vertical structures VP may be spaced apart from the common source pattern CP. The horizontal semiconductor layer 100 may be disposed between the vertical structures VP and the common source pattern CP, and lower portions of the vertical structures VP may be disposed in the horizontal semiconductor layer 100. The source structure SC may be electrically connected to the common source pattern CP through the horizontal semiconductor layer 100. Thus, the vertical semiconductor patterns VS may be connected to the common source pattern CP through the source structure SC and the horizontal semiconductor layer 100. The vertical portions (see, e.g., SP of FIGS. 4 and 5) of the first source conductive pattern SCP1 may be inserted into an upper portion of the horizontal semiconductor layer 100.

The gap-fill insulation pattern GS may be spaced apart from the upper surface of the common source pattern CP with the horizontal semiconductor layer 100 therebetween. The gap-fill insulation pattern GS may overlap the common source pattern CP.

Figure 26:
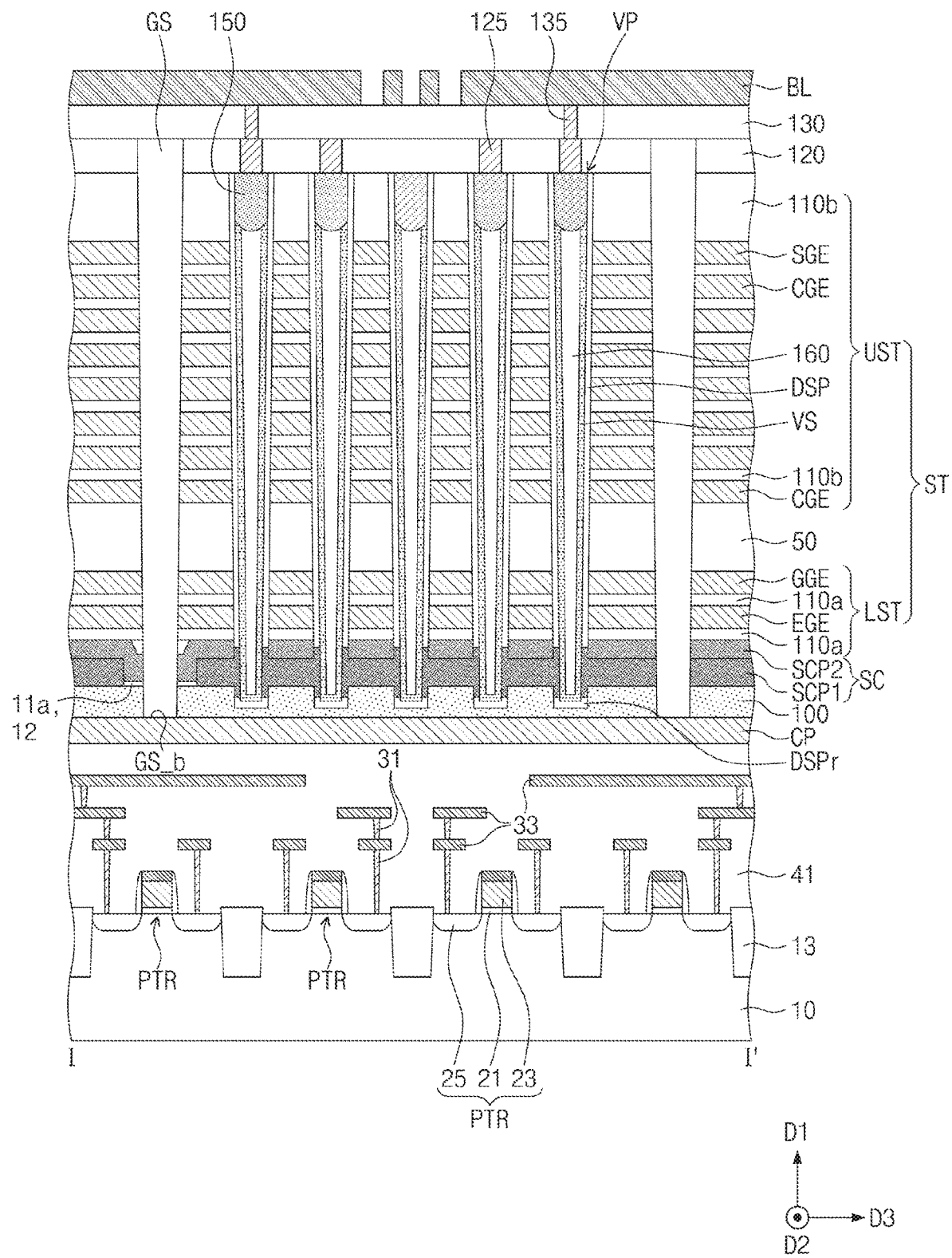
FIG. 26 is a cross-sectional view taken along line I-I' of FIG. 2, illustrating a method of manufacturing a three-dimensional semiconductor memory device according to example embodiments.

FIG. 26 is a cross-sectional view taken along line I-I' of FIG. 2, illustrating a method of manufacturing a three-dimensional semiconductor memory device. The same numerals are used to denote the same elements as shown in FIGS. 17 to 25, and thus detailed descriptions thereof are omitted.

In the present embodiment, the gate separation regions GIR shown in FIG. 24 may be formed to further extend to expose the common source pattern CP. Thus, the lower surfaces GS_b of the gap-fill insulation patterns GS filling the gate separation regions GIR may contact the common source pattern CP. The gap-fill insulation patterns GS may penetrate the horizontal semiconductor layer 100.

Figure 27:
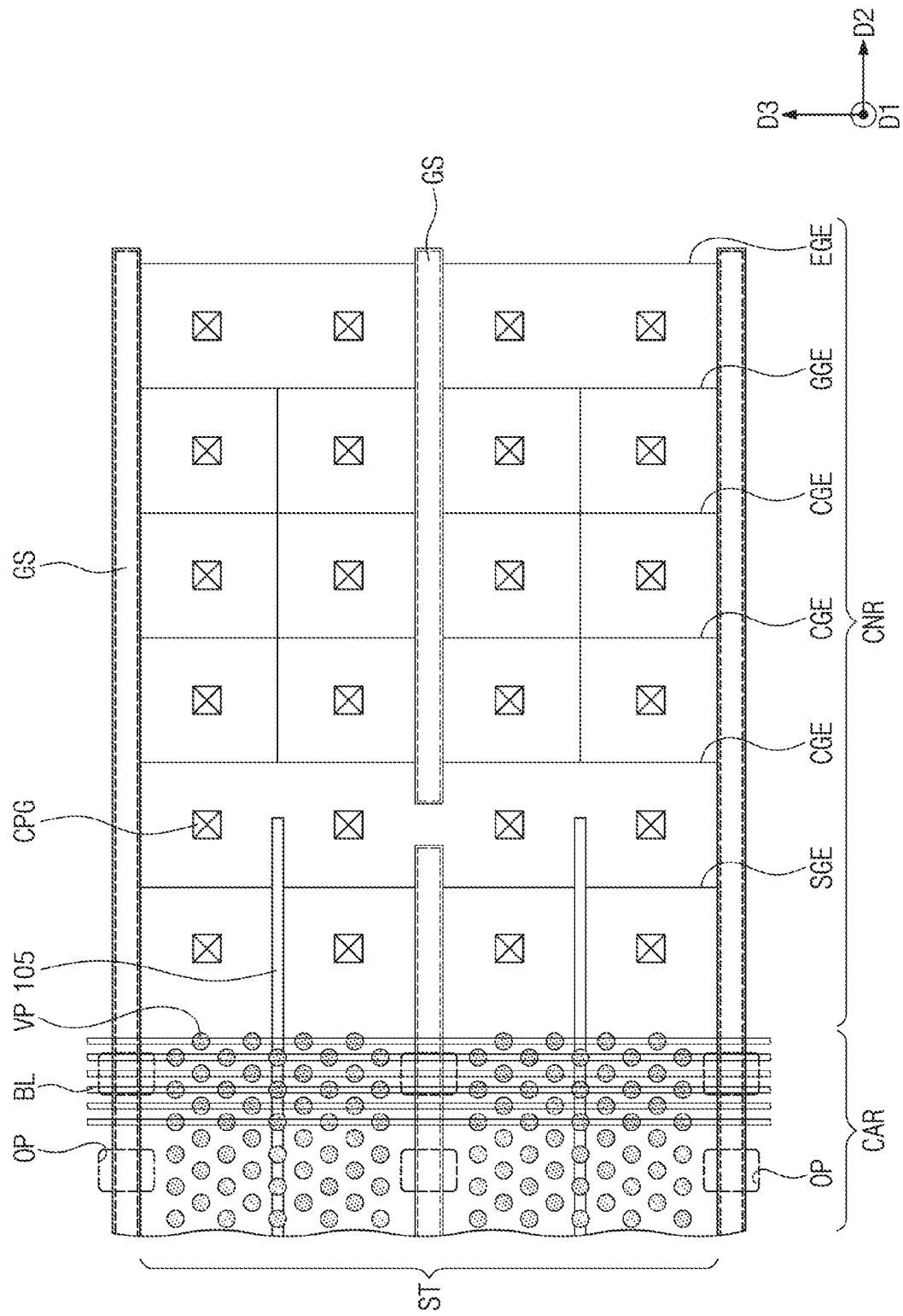
FIG. 27 is a planar view illustrating a three-dimensional semiconductor memory device including a cell array region and a connection region according to example embodiments.
Figure 28:
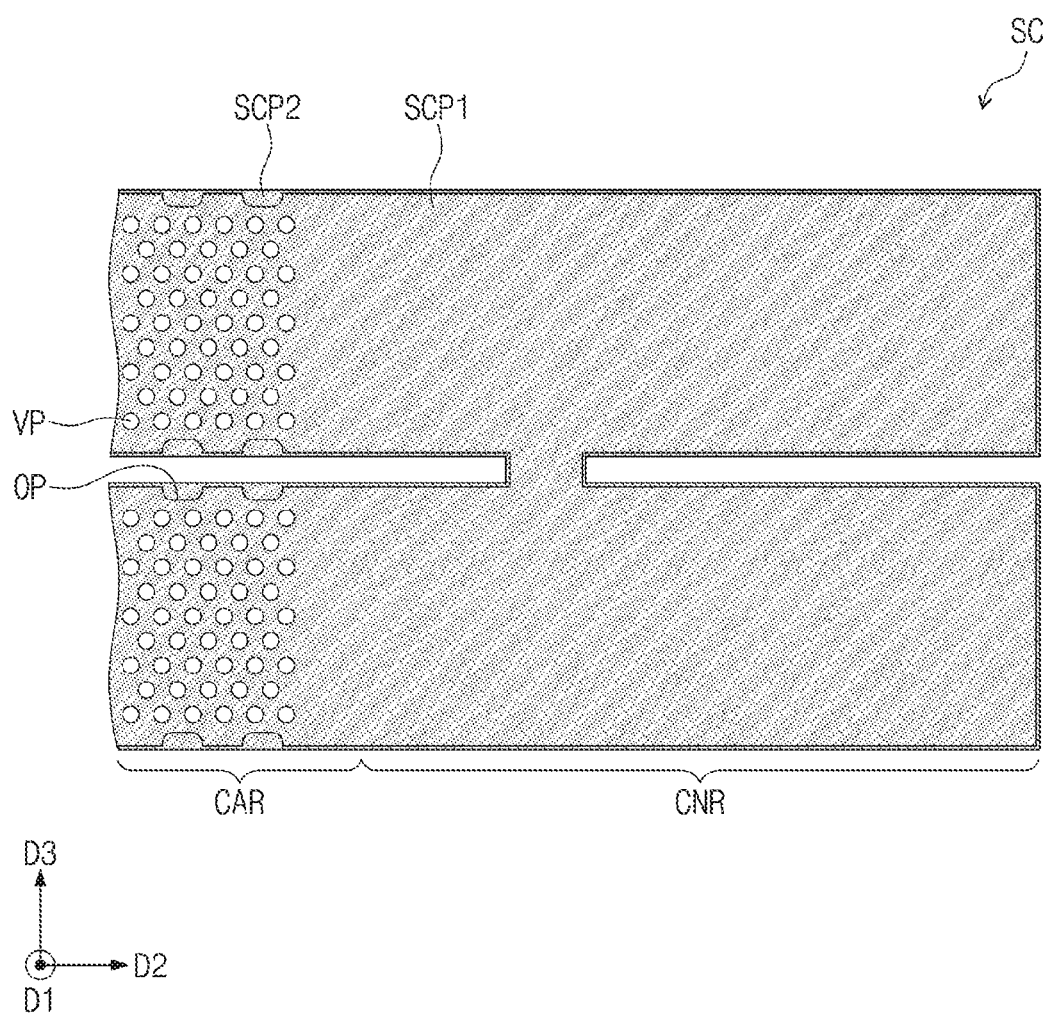
FIGS. 28 to 31 are planar views illustrating a source structure, a cell gate electrode, an erase control gate electrode, and a common source pattern of FIG. 27.
Figure 29:
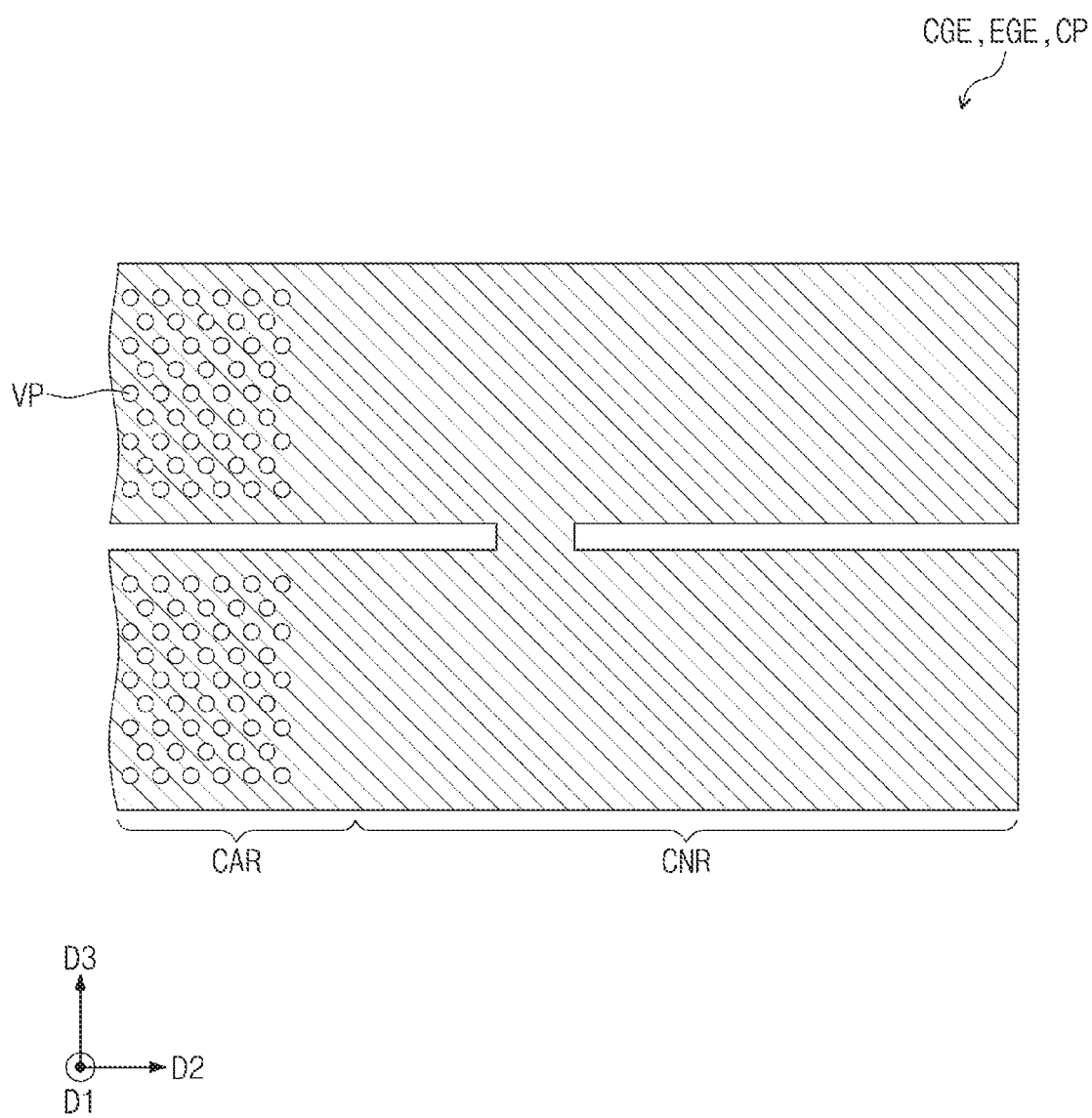
Figure 30:
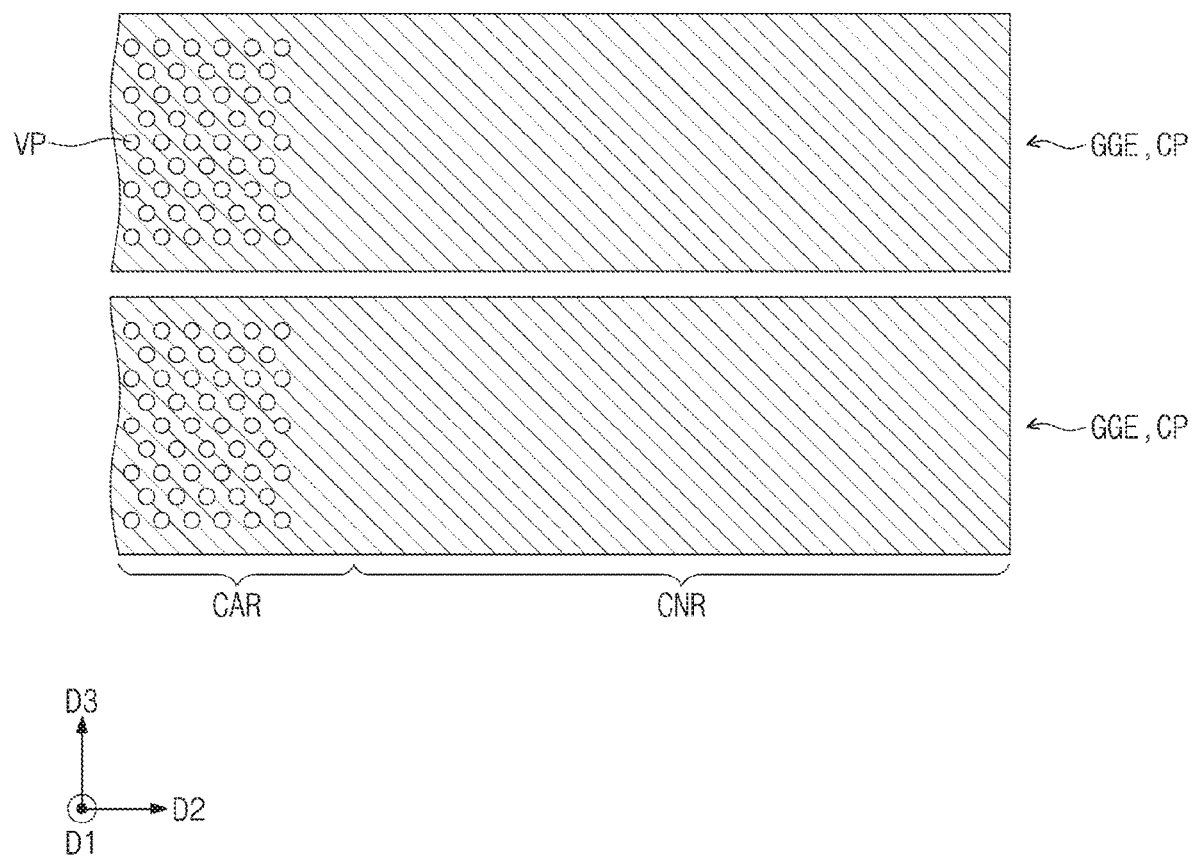
Figure 31:
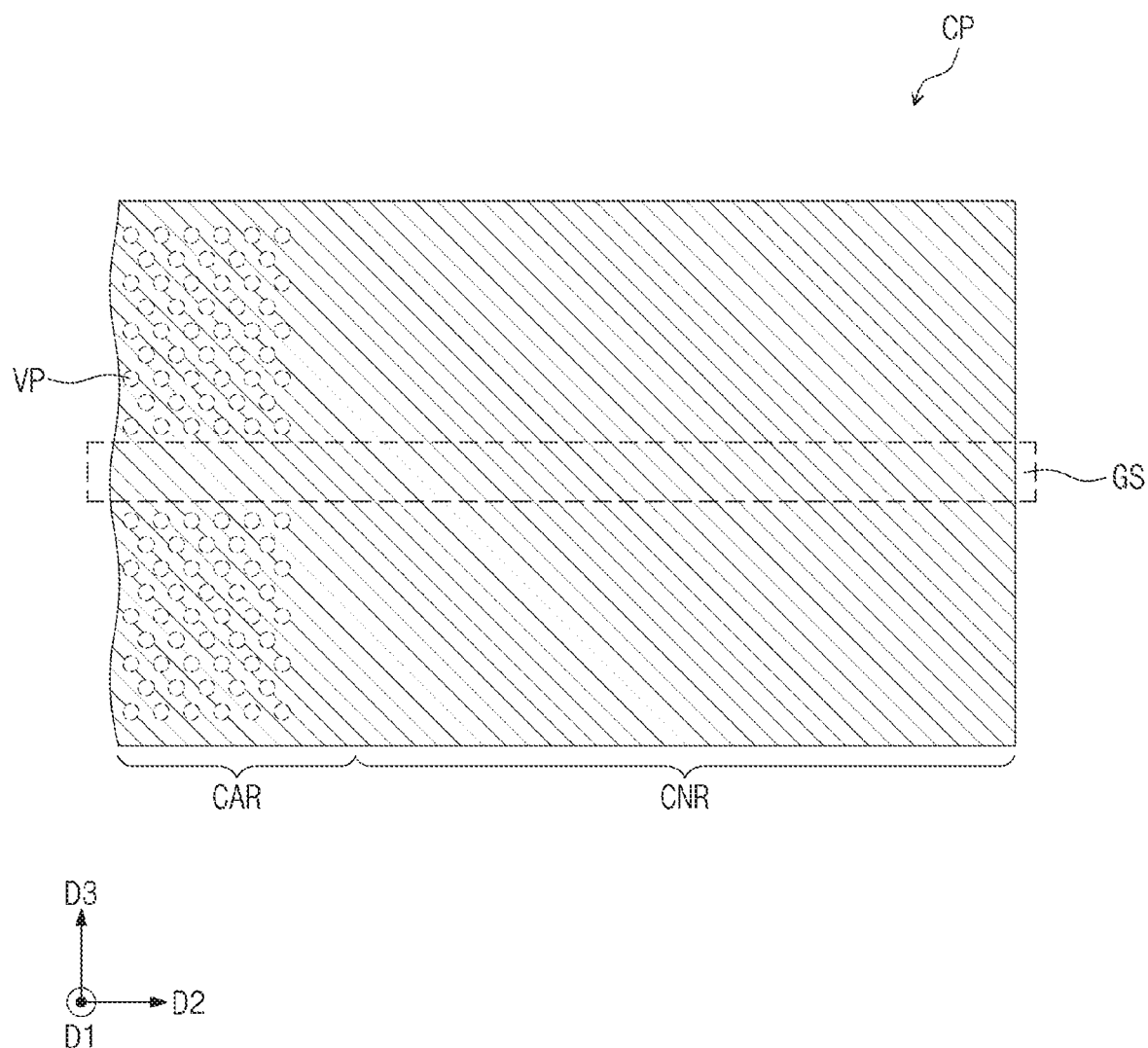

FIG. 27 is a planar view illustrating a three-dimensional semiconductor memory device including a cell array region and a connection region according to example embodiments. FIG. 28 is a planar view illustrating a source structure in the cell array region and the connection region of FIG. 27. FIG. 29 is a plan view illustrating a cell gate electrode, an erase control gate electrode, and a common source pattern in the cell array region and the connection region of FIG. 27. FIG. 30 is a plan view illustrating ground select gate electrodes and a common source pattern. FIG. 31 is a plan view illustrating a common source pattern.

Referring to FIGS. 27 to 31, in a three-dimensional semiconductor memory device including a cell array region CAR and a connection region CNR according to example embodiments, the first source conductive pattern SCP1 may partly have recess sidewalls OP. The second source conductive pattern SCP2 may extend from an upper surface of the first source conductive pattern SCP1 onto the recess sidewalls OP of the first source conductive pattern SCP1. The source conductive structure SC may have a structure in which a pair of linear parts extending in the second direction D2 are connected to each other in the connection region CNR. The gate electrodes SGE, CGE, GGE, and EGE may have a stair stepped shape in the second direction D2 in the connection region CNR. Contact plugs CPG may be disposed on the gate electrodes SGE, CGE, GGE, and EGE.

The cell gate electrode CGE and the erase gate electrode EGE may have a structure in which a pair of linear parts extending in the second direction D2 are connected to each other in the connection region CNR. As shown in FIG. 30, a pair of linear parts of the ground select electrode GGE extending in the second direction D2 may not be connected to each other in the connection region CNR. The source structure SC, the cell gate electrode CGE, the erase control gate electrode EGE, and the ground select gate electrode GGE may include through-holes through which the vertical structures VP may extend.

The common source pattern CP may have various shapes according to the method of forming the common source pattern CP. In some embodiments, referring to FIG. 29, the common source pattern CP may have a structure in which a pair of linear parts extending in the second direction D2 may be connected to each other in the connection region CNR. The common source pattern CP may include through holes (e.g., the source through-holes CPH of FIGS. 4 and 5) through which the vertical structures VP may extend. In some embodiments, referring to FIG. 30, the pair of linear parts of the common source pattern CP extending in the second direction D2 may not be connected to each other in the connection region CNR. A shape of the common source pattern CP shown in FIGS. 29 and 30 may be formed by the manufacturing method described with reference to FIGS. 5 to 15. Referring to FIG. 31, the common source pattern CP may not be separated by the gap-fill insulation pattern GS. In addition, the common source pattern CP may not be penetrated by the vertical structures VP. A shape of the common source pattern CP shown in FIG. 31 may be formed by the manufacturing method described with reference to FIGS. 17 to 26.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A three-dimensional semiconductor memory device comprising:
   a substrate;
   an electrode structure including gate electrodes stacked on the substrate;
   a source structure between the electrode structure and the substrate;

vertical semiconductor patterns passing through the electrode structure and the source structure;
a data storage pattern between each of the vertical semiconductor patterns and the electrode structure; and
a common source pattern between the source structure and the substrate,
wherein the common source pattern has a lower resistivity than the source structure and is connected to the vertical semiconductor patterns through the source structure,
wherein the vertical semiconductor patterns pass through the common source pattern.

2. The device of claim 1, wherein the common source pattern including tungsten, titanium, tantalum, and/or a conductive nitride thereof.

3. The device of claim 2, further comprising a dummy data storage pattern covering a lower portion of each of the vertical semiconductor patterns,
wherein the dummy data storage pattern passes through the common source pattern.

4. The device of claim 2, wherein a lower surface of the source structure contacts an upper surface of the common source pattern.

5. The device of claim 2, wherein the source structure comprises:
vertical portions extending along sidewalls of the vertical semiconductor patterns; and
a horizontal portion laterally extending from the vertical portions and below the electrode structure.

6. The device of claim 5, wherein lower portions of the vertical portions of the source structure are connected to an upper portion of the common source pattern.

7. The device of claim 5, further comprising a source insulation pattern between the horizontal portion of the source structure and the common source pattern.

8. The device of claim 2, wherein the electrode structure includes a plurality of electrode structures separated by a gap-fill insulation pattern, and
wherein the gap-fill insulation pattern passes through the common source pattern.

9. The device of claim 8, further comprising:
a first wiring on the electrode structure;
a second wiring between the common source pattern and the substrate; and
a through via passing through the gap-fill insulation pattern to connect the first wiring and the second wiring.

10. The device of claim 1 wherein the common source pattern is spaced apart from the vertical semiconductor patterns.

11. The device of claim 10, wherein the electrode structure includes a plurality of electrode structures separated by a gap-fill insulation pattern, and
wherein the gap-fill insulation pattern overlaps the common source pattern.

12. The device of claim 1, further comprising a horizontal semiconductor layer between the source structure and the common source pattern,
wherein lower portions of the vertical semiconductor patterns are in the horizontal semiconductor layer and
wherein the vertical semiconductor patterns are connected to the common source pattern through the source structure and the horizontal semiconductor layer.

13. The device of claim 12, wherein the electrode structure includes a plurality of electrode structures separated by a gap-fill insulation pattern, and
wherein a lower surface of the gap-fill insulation pattern is spaced apart from an upper surface of the common source pattern with the horizontal semiconductor layer therebetween.

14. The device of claim 12, wherein the source structure includes vertical portions extending along sidewalls of the vertical semiconductor patterns, and
wherein lower portions of the vertical portions are connected to the horizontal semiconductor layer.

15. The device of claim 12, wherein the electrode structure includes a plurality of electrode structures separated by a gap-fill insulation pattern, and
wherein a lower surface of the gap-fill insulation pattern contacts an upper surface of the common source pattern.

16. A three-dimensional semiconductor memory device comprising:
a substrate;
an electrode structure including gate electrodes stacked on the substrate;
a source structure between the electrode structure and the substrate;
vertical semiconductor patterns passing through the electrode structure and the source structure;
a data storage pattern between each of the vertical semiconductor patterns and the electrode structure;
a common source pattern between the source structure and the substrate and connected to a lower surface of the source structure; and
a source insulation pattern between the source structure and the common source pattern,
wherein the vertical semiconductor patterns passes through the common source pattern.

17. The device of claim 16, wherein the electrode structure includes a plurality of electrode structures separated by a gap-fill insulation pattern, and
wherein the gap-fill insulation pattern penetrates the common source pattern.

18. The device of claim 17, wherein the source structure extends along a sidewall of the gap-fill insulation pattern and penetrates the source insulation pattern.

19. The device of claim 16, wherein the source structure comprises:
vertical portions extending along sidewalls of the vertical semiconductor patterns; and
a horizontal portion laterally extending from the vertical portions and below the electrode structure.

20. The device of claim 19, wherein lower portions of the vertical portions of the source structure are in the common source pattern.

21. The device of claim 16, further comprising a peripheral logic structure between the substrate and the common source pattern,
wherein the peripheral logic structure comprises a peripheral logic circuit, a lower interlayer insulation layer covering the peripheral logic circuit, and a first wiring in the lower interlayer insulation layer, and
wherein the common source pattern is on the lower interlayer insulation layer.

22. The device of claim 21, wherein the electrode structure includes a plurality of electrode structures separated by a gap-fill insulation pattern, and
wherein the gap-fill insulation pattern includes a void.

23. The device of claim 21, further comprising:
a gap-fill insulation pattern separating the electrode structure into two electrode structures;
a second wiring on the electrode structure; and a through via passing through the gap-fill insulation pattern and connecting the first wiring and the second wiring.

24. A three-dimensional semiconductor memory device comprising:
   a substrate;
   an electrode structure including gate electrodes stacked on the substrate;
   a first conductive layer between the electrode structure and the substrate;
   vertical semiconductor patterns passing through the electrode structure and the first conductive layer;
   a data storage pattern between each of the vertical semiconductor patterns and the electrode structure; and
   a second conductive layer between the first conductive layer and the substrate,
   wherein the first conductive layer comprises:
      vertical portions along sidewalls of the vertical semiconductor patterns; and
      a horizontal portion laterally extending from the vertical portions and below the electrode structure, and
   wherein lower portions of the vertical portions are connected to the second conductive layer,
   wherein the vertical semiconductor patterns pass through the second conductive layer.

25. The device of claim 24, wherein the electrode structure includes a plurality of electrode structures separated by a gap-fill insulation pattern, and
   wherein the gap-fill insulation pattern penetrates the second conductive layer.

26. The device of claim 25, further comprising a source insulation pattern between the first conductive layer and the second conductive layer,
   wherein the first conductive layer extends along a sidewall of the gap-fill insulation pattern and penetrates the source insulation pattern.

* * * * *